United States Patent
Chen et al.

(10) Patent No.: US 10,438,671 B1
(45) Date of Patent: Oct. 8, 2019

(54) REDUCING PROGRAM DISTURB BY MODIFYING WORD LINE VOLTAGES AT INTERFACE IN TWO-TIER STACK DURING PROGRAMMING

(71) Applicant: SanDisk Technologies LLC, Addison, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/015,612

(22) Filed: Jun. 22, 2018

(51) Int. Cl.
*G11C 16/34* (2006.01)
*G11C 16/04* (2006.01)
*G11C 16/10* (2006.01)
*G11C 11/56* (2006.01)

(52) U.S. Cl.
CPC ...... *G11C 16/3427* (2013.01); *G11C 16/0483* (2013.01); *G11C 16/10* (2013.01); *G11C 11/5671* (2013.01); *G11C 16/3459* (2013.01)

(58) Field of Classification Search
CPC ................... G11C 16/3427; G11C 16/0438
See application file for complete search history.

(56) References Cited

U.S. PATENT DOCUMENTS

| 8,559,235 | B2 * | 10/2013 | Yoon | G11C 16/0483 365/185.29 |
|---|---|---|---|---|
| 8,570,808 | B2 * | 10/2013 | Park | G11C 11/5642 365/185.18 |
| 8,576,629 | B2 * | 11/2013 | Choe | G11C 16/0483 365/185.14 |
| 9,286,987 | B1 | 3/2016 | Dong et al. | |
| 9,286,994 | B1 | 3/2016 | Chen et al. | |
| 9,361,993 | B1 | 6/2016 | Chen et al. | |
| 9,378,826 | B2 * | 6/2016 | Lee | G11C 16/10 |
| 9,378,831 | B2 * | 6/2016 | Han | G11C 16/16 |
| 9,466,369 | B1 | 10/2016 | Pang et al. | |
| 9,570,463 | B1 | 2/2017 | Zhang et al. | |
| 9,640,273 | B1 | 5/2017 | Chen et al. | |
| 9,747,992 | B1 | 8/2017 | Chen et al. | |
| 10,163,514 | B2 * | 12/2018 | Luthra | G11C 16/0483 |

(Continued)

OTHER PUBLICATIONS

U.S. Appl. No. 15/814,769, filed Nov. 16, 2017, by Chen et al.

(Continued)

*Primary Examiner* — Son L Mai
(74) *Attorney, Agent, or Firm* — Vierra Magen Marcus LLP

(57) ABSTRACT

Techniques for reducing program disturb of memory cells which are formed in a two-tier stack, when a selected word line is in the upper tier. In one approach, at the start of the program phase of a program loop, voltages of word lines adjacent to the interface are increased to a pass voltage before voltages of remaining word lines are increased to a pass voltage. This delay provides time for residue electrons in the lower tier to move toward the drain end of a NAND string to reduce the likelihood of program disturb. In another approach, the voltages of the word lines adjacent to the interface are maintained at 0 V or other turn-off voltage during the program phase to block the passage of residue electrons from the lower tier to the upper tier.

19 Claims, 20 Drawing Sheets

(56) References Cited

U.S. PATENT DOCUMENTS

2012/0307561 A1* 12/2012 Joo .................. G11C 16/0483
                                                                                                  365/185.17
2016/0284412 A1    9/2016  Nam et al.
2017/0330632 A1  11/2017  Shim et al.
2018/0033492 A1    2/2018  Seo

OTHER PUBLICATIONS

U.S. Appl. No. 15/814,772, filed Nov. 16, 2017, by Chen et al.
U.S. Appl. No. 15/983,365, filed May 19, 2018, by Chen et al.
U.S. Appl. No. 15/726,686, filed Oct. 6, 2017, by Yu et al.
International Search Report & The Written Opinion of the International Searching Authority dated May 23, 2019, International Application No. PCT/US2019/017394.

* cited by examiner

WL_sel position

WL_sel position

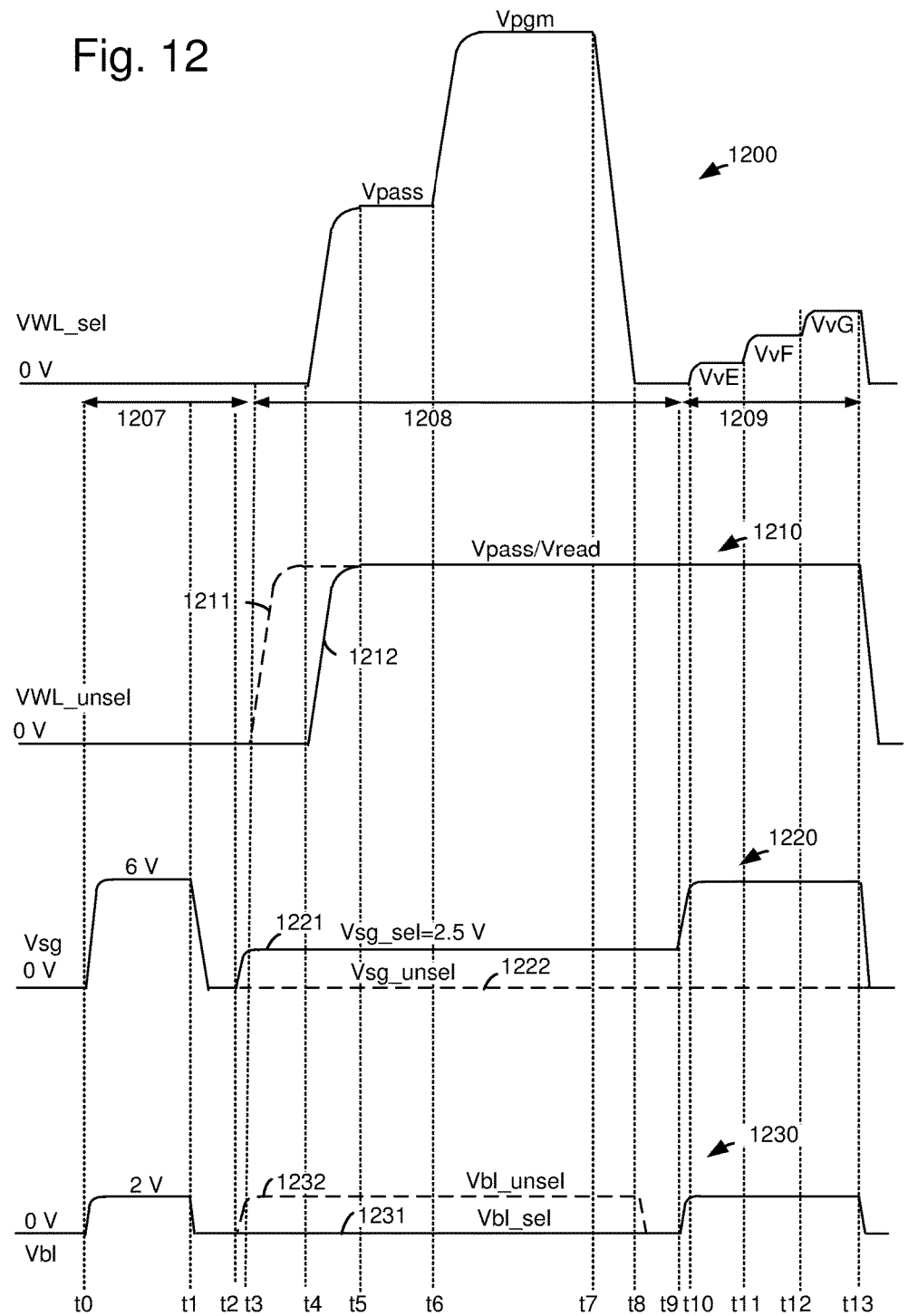

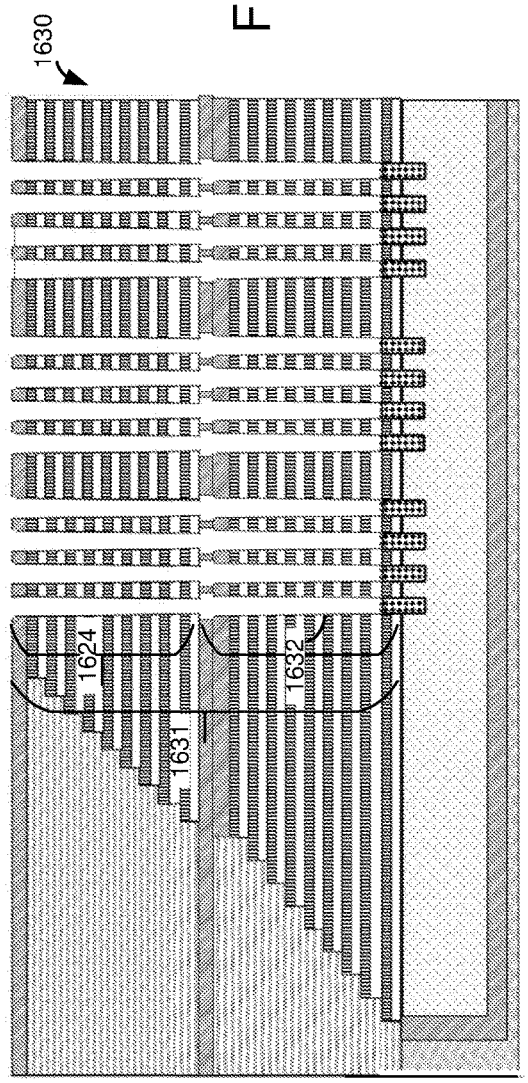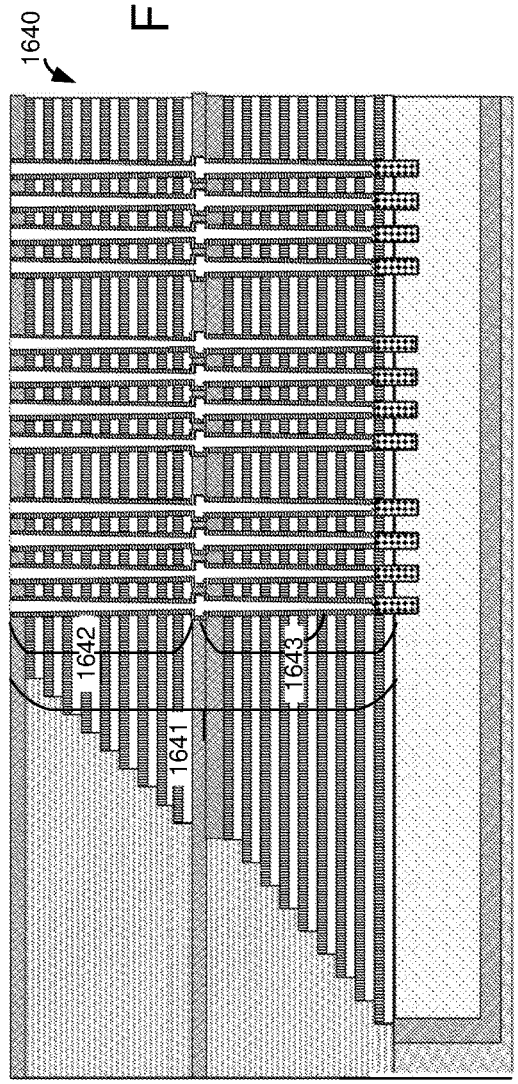

REDUCING PROGRAM DISTURB BY MODIFYING WORD LINE VOLTAGES AT INTERFACE IN TWO-TIER STACK DURING PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 12 depicts examples of voltage signals which can be used in a program loop of a program operation, consistent with step 1104a of FIG. 11A.

FIG. 16C depicts a semiconductor structure in a configuration which is consistent with step 1504 of FIG. 15.

FIG. 16D depicts a semiconductor structure in a configuration which is consistent with step 1505 of FIG. 15.

DETAILED DESCRIPTION

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 14:
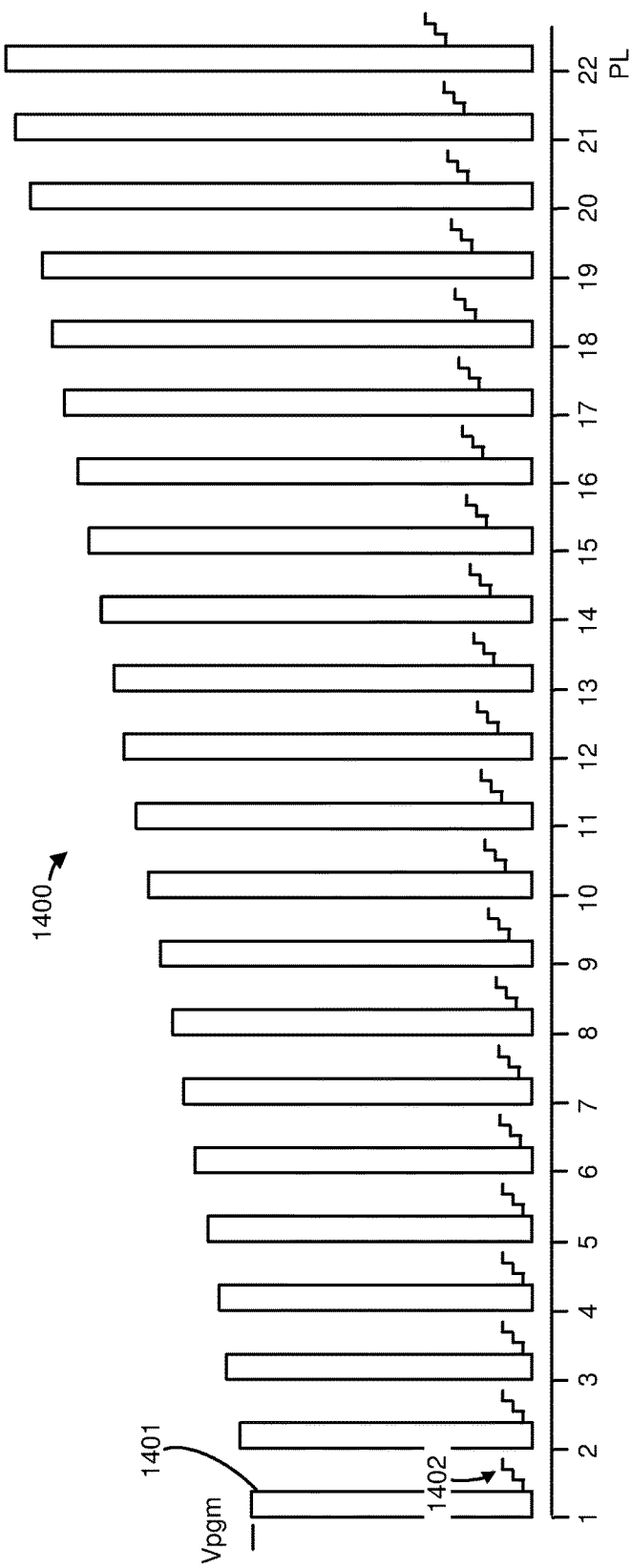
FIG. 14 depicts a voltage signal used in a series of program loops in an example program operation for MLC memory cells which results in the Vth distribution of FIG. 9.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14.

Verify tests may be performed after each program voltage to determine whether the memory cells have completed programming A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 9). In a four-bit per cell memory device, there are sixteen data states including the erased state (S0) and fifteen higher data states (S0-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

However, program disturb can occur for some 3D memory structures in which the memory cells are arranged in vertical NAND strings (or other sets of connected memory cells) in a stack, where the stack comprises alternating conductive and dielectric layers. In this structure, the conductive layers act as word lines which are connected to the memory cells. Each NAND string may have the shape of a pillar which intersects with the word lines to form the memory cells. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. For example, see FIG. 16G where a stack 1626 comprises an upper tier 1616 formed on a lower tier 1605. See also FIG. 5 which depicts word lines WLDL and WLDU adjacent to an interface (IF). The memory hole is etched separately in each tier so that a low aspect ratio can be achieved. However, the dielectric layer or region at the interface (IF) between the tiers is relatively thicker than the other dielectric layers. As a result, the distance between memory cells which are adjacent to the interface will be greater than the other inter-cell distances.

Because of this increased distance, the channel region at the interface tends to be less conductive than other channel regions when a pass voltage is applied to the word lines. The conductivity of the channel region at the interface depends on the strength of a fringing electric field from the word lines which are adjacent to the interface. However, the voltage of these word lines cannot be increased to a high level to increase the fringing field because this may cause program disturb for the associated memory cells. As a result, in the program phase of a program loop, residue electrons which are initially below the interface, in the lower tier, will require a relatively long time to travel to the drain end of the NAND string compared to residue electrons which are initially above the interface, in the upper tier. The residue electrons are attracted to the drain side of the unselected NAND string when a positive bit line voltage is applied. The selected word line voltage is relatively high by the time the lower tier residue electrons reach the upper tier, due to the delay in the residue electrons moving through the interface. This word line voltage attracts the electrons into the charge trapping layer of the memory cell connected to the selected word line, causing a hot electron injection type of program disturb. This type of program disturb generally affects memory cells in unselected NAND strings in the upper tier of a two-tier stack.

If a stack had more than two tiers, the program disturb can affect memory cells in each of the tiers which are above the bottommost tier.

Another factor in the program disturb is a channel gradient which may be formed between the selected word line and the adjacent word line, depending on the data pattern. In some cases, a relatively large channel gradient may be formed which accelerates the residue electrons to facilitate their movement into the charge trapping layer of the memory cell.

Techniques provided herein address the above and other issues. In one aspect, the voltages of the interface unselected word lines are increased to a pass voltage, before the voltages of the non-interface unselected word lines and the selected word line are increased to a pass voltage. This allows the residue electrons in the lower tier to have more time to transition through the interface toward the drain end of the NAND string and the bit line. This is a delay-based countermeasure.

In another aspect, the delay in increasing the voltages of the non-interface unselected word lines relative to the time of increasing the voltages of the interface unselected word lines is a function of temperature. For example, program disturb may be more likely when temperatures are relatively high so that the delay is greater when the temperature is greater.

In another aspect, the pass voltages of the interface unselected word lines (e.g., WLDL and WLDU in FIG. 5) are higher than the pass voltages of the non-interface unselected word lines (e.g., WL0-WL47 and WL48-WL95 in FIG. 5), to provide a greater fringing field in the interface.

In another aspect, the pass voltage of the interface unselected word line above the interface (e.g., WLDU) is lower than the pass voltage of the interface unselected word line below the interface (e.g., WLDL), to account for a narrower memory hole diameter.

In another aspect, the voltages of the interface unselected word lines are kept at a turn-off voltage such as 0 V throughout the program phase to block the residue electrons in the lower tier from reaching the upper tier. In this case, a further measure can be taken to avoid creating a large channel gradient adjacent to the interface unselected word lines which could cause program disturb for associated memory cells. The further measure can involve reducing the pass voltage to Vpass_low for the unselected word lines adjacent to the WLDL and WLDU. These unselected word lines are WL47 and WL48, respectively, in FIG. 5. The nominal pass voltage, Vpass>Vpass_low can be applied to the remaining non-interface unselected word lines (e.g., WL0-WL46 and WL49-WL95). This approach is an electron blocking countermeasure, and advantageously avoids any delay in the programming time.

The program disturb countermeasures discussed above can be selectively implemented as a function of a position of the selected word line in the stack. This helps minimize any delays. For example, a countermeasure can be implemented when the selected word line is in the upper tier but not the lower tier. In another approach, a countermeasure can be implemented when the selected word line is in the upper tier and is separated from the interface by at least one other data word line. In another approach, a countermeasure can be implemented when the selected word line is in the bottom half or other lower part of the upper tier since this part of the upper tier may be more susceptible to the injection type of program disturb than an upper part of the upper tier.

These and other features are discussed further below.

Figure 1A:
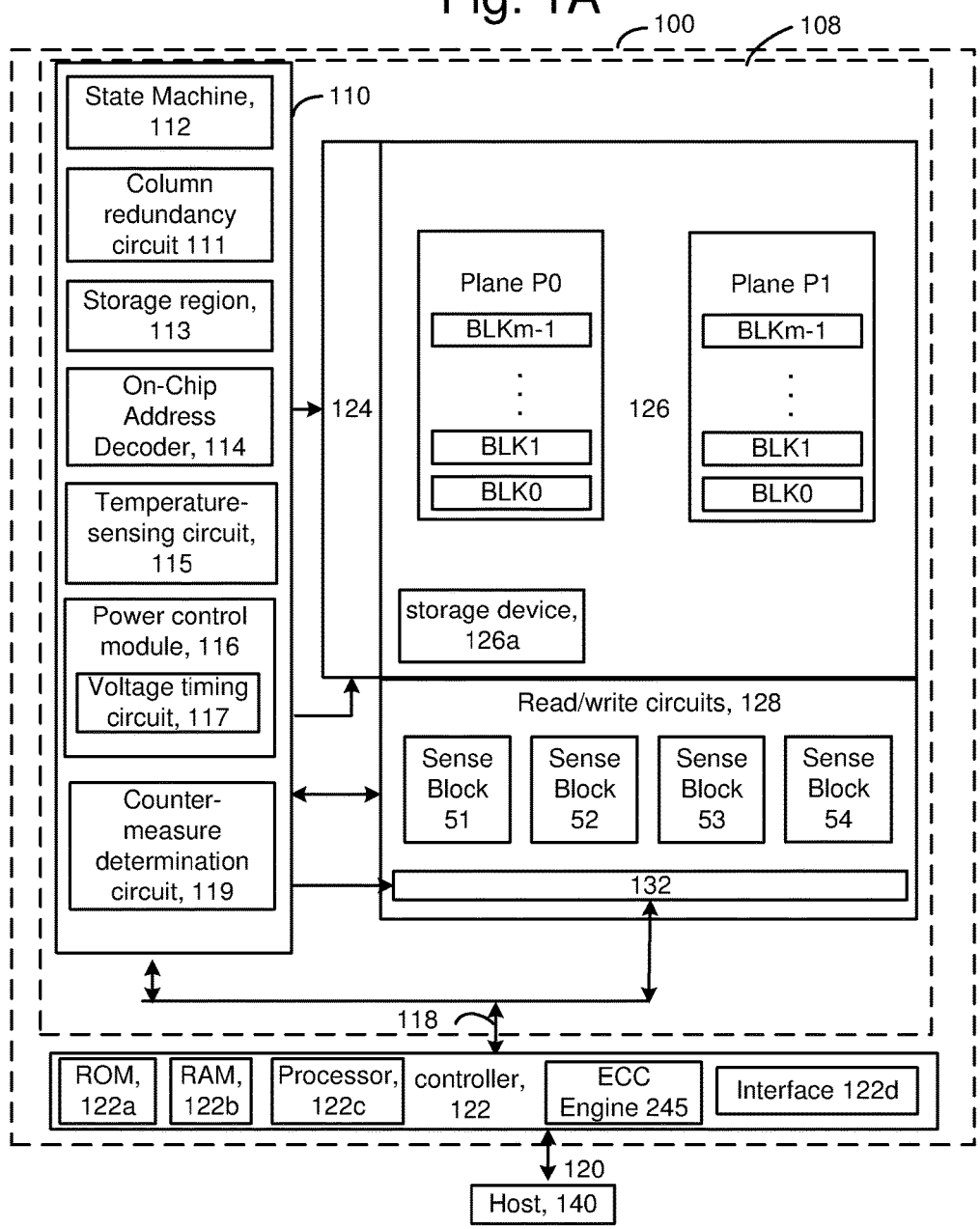
FIG. 1A is a block diagram of an example memory device.

FIG. 1A is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, a temperature-sensing circuit 115, a power control module 116 (power control circuit) and a countermeasure determination circuit 119. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The temperature-sensing circuit 115 can be used to determine a temperature, and the temperature in turn can be used by the voltage timing circuit to determine a delay. See also FIG. 11B. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The power control module can include a voltage timing circuit 117 which stores data used in determining when to apply voltage signals. For example, the data can indicate an amount of a delay in increasing voltages of non-interface unselected word lines relative to an increase in voltages of interface unselected word lines, as a program disturb countermeasure. See FIGS. 12 and 13 for example voltage signals. The delay can be implemented at the start of a program phase of a program loop, for example.

The voltage timing circuit 117 may be configured with hardware, firmware and/or software for performing the techniques described herein including the processes of the flowcharts described herein.

The countermeasure determination circuit may determine whether to implement a program disturb countermeasure, and what type of countermeasure to implement based on factors such as the selected word line position (WL_sel) and the temperature. For example, the circuit may obtain an identifier of WL_sel from the address provided in a program command, and decide whether WL_sel is within a specified range of word lines for which a countermeasure should be performed.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, temperature-sensing circuit 115, power control module 116, countermeasure determination circuit 119, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

Figure 11A:
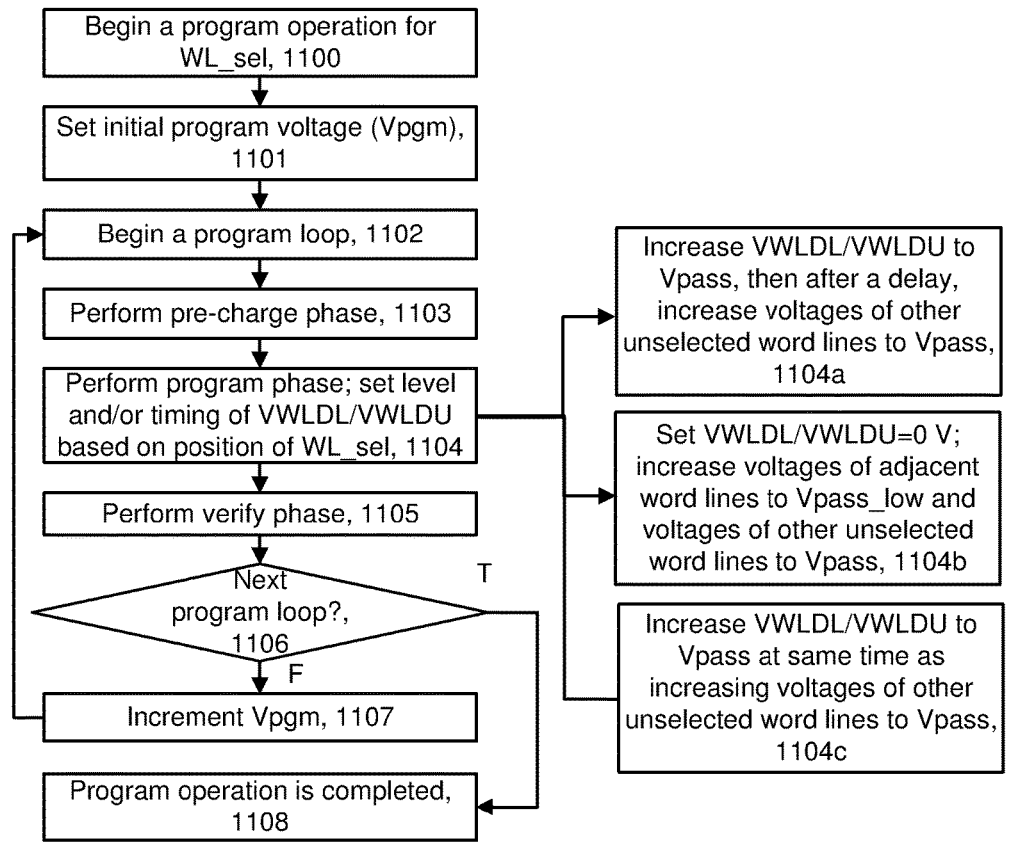
FIG. 11A depicts an example programming operation for a selected word line, WL_sel, which addresses the problem of residue electrons as discussed in connection with FIGS. 10A and 10B.

The controller 122 or control circuitry 110 can be configured with hardware, firmware and/or software for implementing the processes described herein, including the processes of the flowchart of FIG. 11A.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
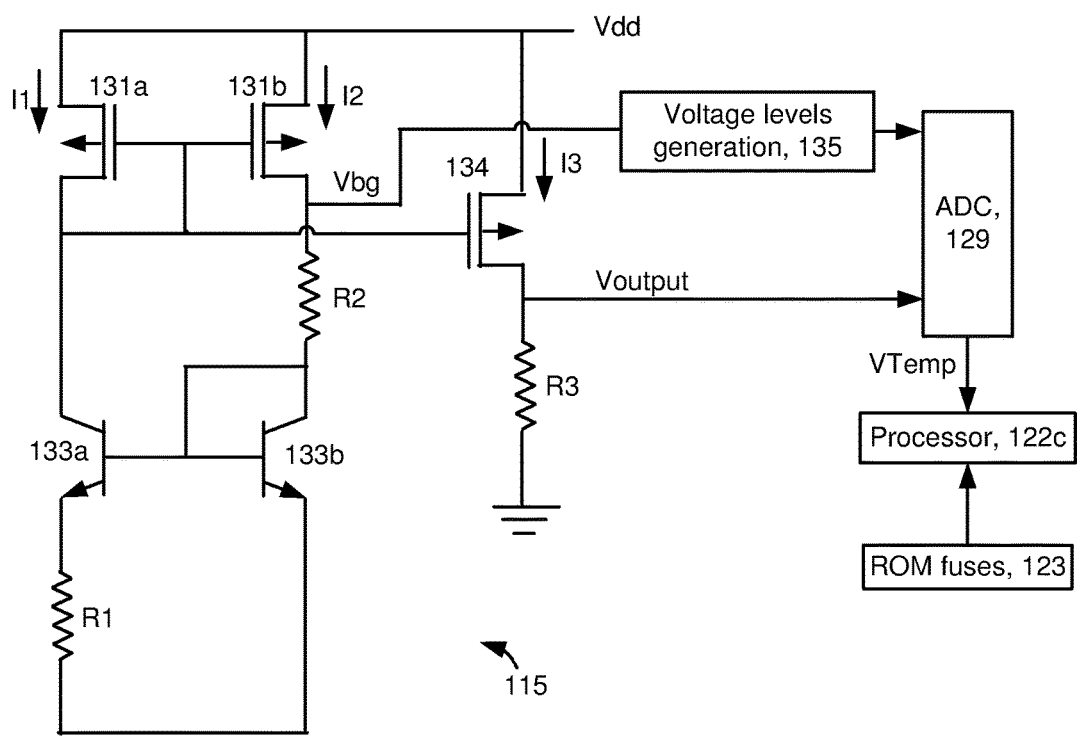
FIG. 1B depicts an example of the temperature-sensing circuit 115 of FIG. 1A.

FIG. 1B depicts an example of the temperature-sensing circuit 115 of FIG. 1A. The circuit includes pMOSFETs 131$a$, 131$b$ and 134, bipolar transistors 133$a$ and 133$b$ and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122$c$. This is data indicating a temperature of the memory device, and may be used by the countermeasure determination circuit 119, for example. See also FIG. 11B. ROM fuses 123 store data which correlates the matching voltage level to a temperature, in one approach. The processor then uses the temperature to set temperature-based parameters in the memory device such as by using the PL and Vpgm transition setting circuit, and the Vpass_el setting circuit.

Vbg, is obtained by adding the base-emitter voltage (Vbe) across the transistor 131$b$ and the voltage drop across the resistor R2. The bipolar transistor 133$a$ has a larger area (by a factor N) than the transistor 133$b$. The PMOS transistors 131$a$ and 131$b$ are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131$a$ and 131$b$ and the current through the transistor 134 mirrors the current through the transistors 131$a$ and 131$b$.

Figure 2:
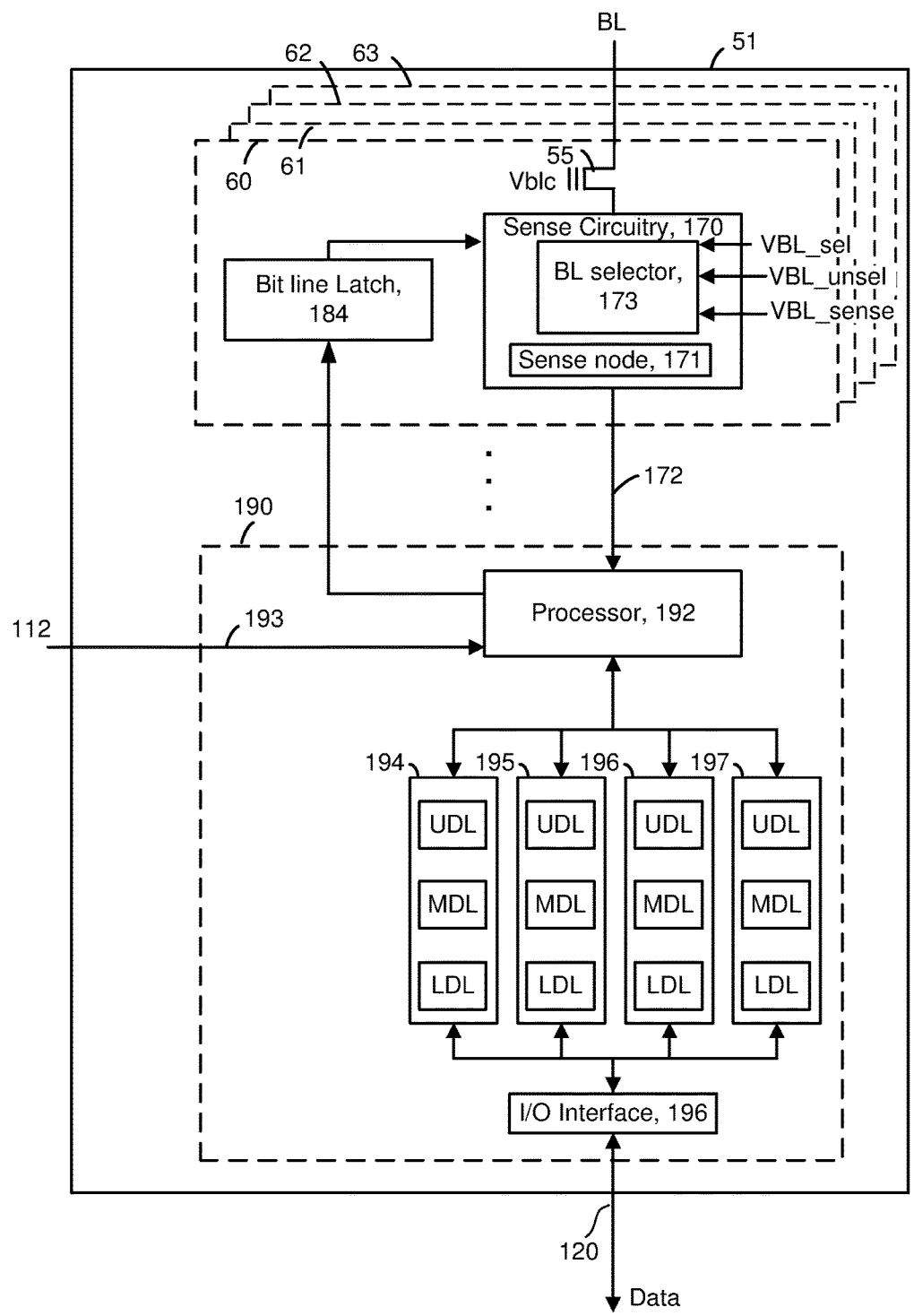
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 60, as an example, comprises sense circuitry 170 that performs sensing by determining whether a conduction current in a connected bit line is above or below a predetermined threshold level. The sense circuitry may include a sense node 171 which is charged up during sensing. An amount of decay of the sense node is used to determine whether a memory cell is in a conductive or non-conductive state. Sense circuit 60 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming During a program operation, the flag can be provided to a bit line (BL) selector 173 which is configured to pass VBL_sel, a voltage for a selected bit line (connected to a selected NAND string), or VBL_unsel, a voltage for an unselected bit line (connected to an unselected NAND string), to the bit line. VBL_unsel, e.g., 2 V, inhibits programming while VBL_sel, e.g., 0 V, does not inhibit programming.

During a sensing operation, the BL selector may pass a sense voltage, VBL_sense, e.g., 2 V, to a transistor 55 to charge up the bit line. The transistor 55 may be provided between the bit line and the sense circuitry to clamp a voltage of the bit line during the sensing operation. Vbl is clamped at a level which is equal to the control gate voltage Vblc minus the Vth of the transistor. For example, Vbl may be clamped at 2−1=1 V. VBL_sense is applied to the drain of the transistor and Vbl is provided is at the source of the transistor, which acts as a source-follower.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation.

The program operation, under the control of the state machine, comprises a series of programming voltage pulses applied to the control gates of the addressed storage elements. See FIG. 14. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify voltage. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. An MDL or UDL latch is flipped when a middle or upper page bit, respectively, is stored in an associated storage element. This occurs when an associated storage element completes programming, e.g., when its Vth exceeds a target verify voltage such as VvA-VvG (see FIG. 9).

Figure 3:
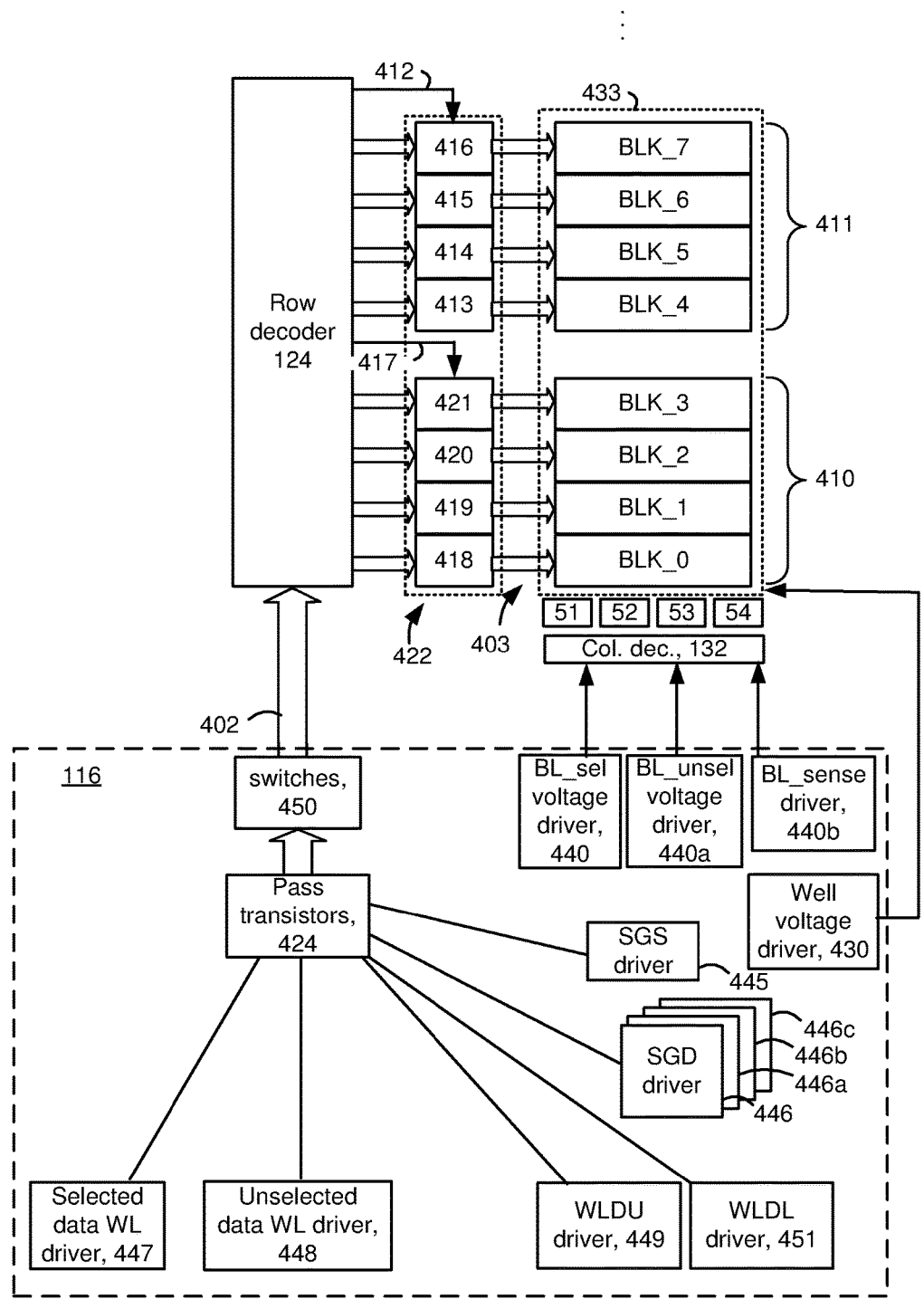
FIG. 3 depicts an example implementation of the power control module 116 of FIG. 1A for providing voltages to blocks of memory cells.

FIG. 3 depicts an example implementation of the power control module 116 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include a driver 448 for unselected data word lines. These can be remaining, unselected word lines other than the selected word line. The voltage drivers can also include an upper interface word line driver 449 which provides voltages on an upper interface word line WLDU, and a lower interface word line driver 451 which provides voltages on a lower interface word line WLDL. See FIG. 5. WLDU is adjacent to and above an interface of a multi-tier stack, and WLDL is adjacent to and below the interface.

Figure 7:
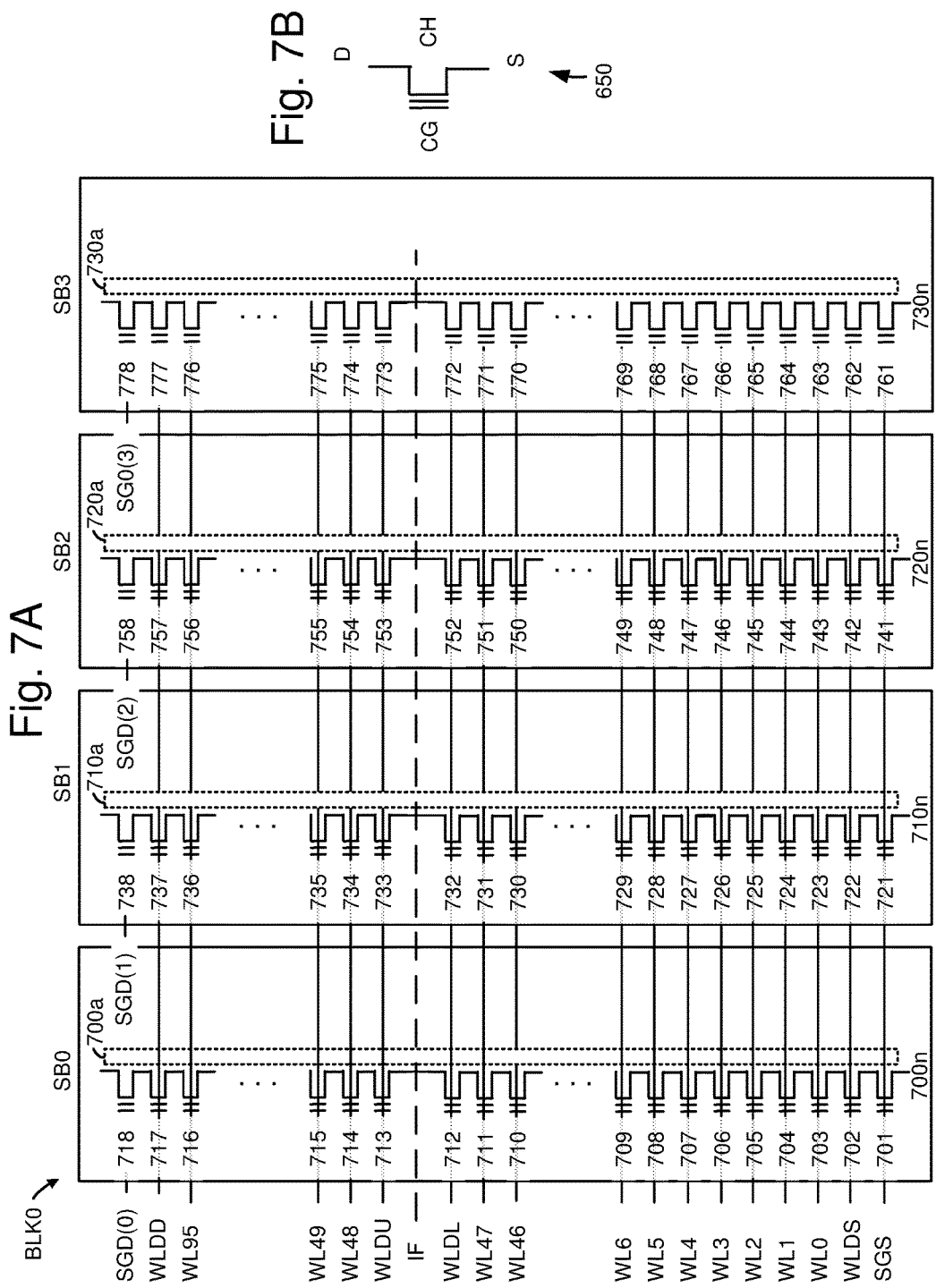
FIG. 7A depicts an example view of NAND strings in sub-blocks in a 3D configuration which is consistent with the two-tier stack of FIG. 5.
FIG. 7B depicts an example transistor 650 which represents any of the memory cells or select gate transistors of FIG. 7A.

The voltage drivers can also include separate SGD drivers for each sub-block in a block. For example, in BLK0 as depicted in FIG. 7A, SGD drivers 446, 446a, 446b and 446c can be provided for SGD(0)-SGD(3), respectively, in SB0-SB3, respectively. In one option, one SGS driver 445 is common to the different sub-blocks in a block. In another option, separate SGS drivers are provided for each sub-block of a block. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. During a sensing operation, a BL_sense bit line voltage driver 440b provides voltages to the bit lines.

In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
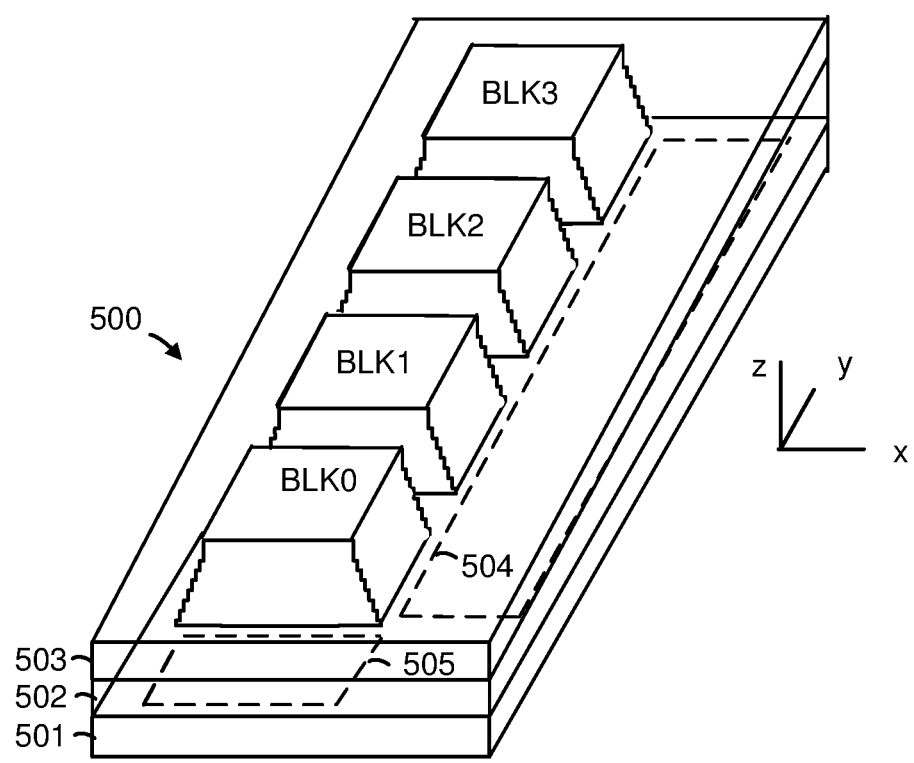
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1A. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
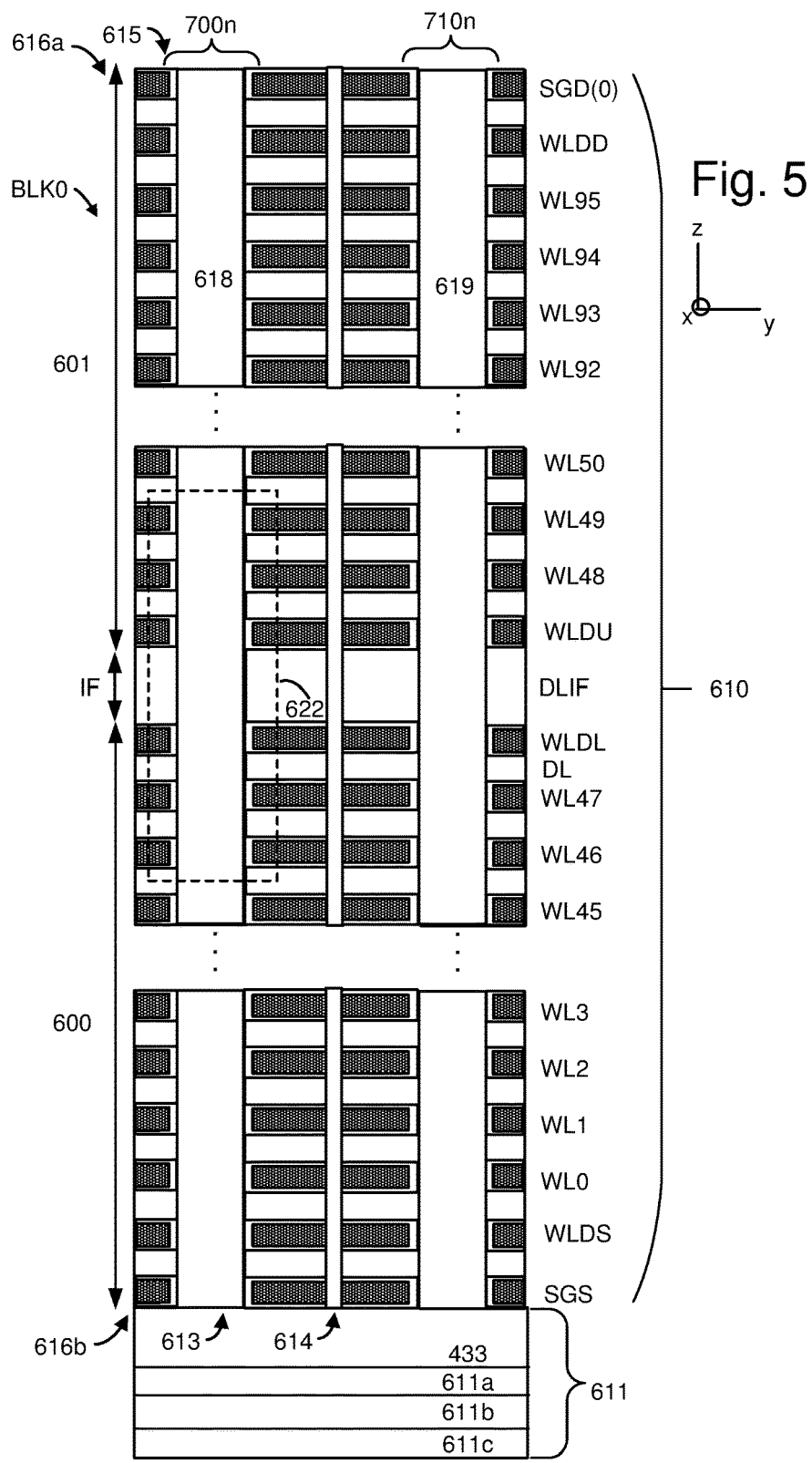
FIG. 5 depicts an example cross-sectional view of a portion of BLK0 of FIG. 4, including NAND strings 700n and 710n.

FIG. 5 depicts an example cross-sectional view of a portion of BLK0 of FIG. 4, including NAND strings 700n and 710n. The block comprises a stack 610 of alternating conductive and dielectric layers in two tiers including a lower tier 600 (e.g., a first tier or a bottom tier) and an upper tier 601 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes 96 data word lines, and the data word lines are evenly divided between the two tiers. DL is an example dielectric layer outside the interface, and DLIF is a dielectric layer of the interface.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 6.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source-end 613 at a bottom 616b of the stack 610 and a drain-end 615 at a top 616a of the stack. Metal-filled slits (see also FIG. 16G) may be provided periodically across the stack as interconnects which extend through the stack, such as to connect the source line to a line above the stack. The slits may be used during the formation of the word lines and subsequently filled with metal. Vias may be connected at one end to the drain-ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers. See also FIG. 16G.

An insulation-filled region 614 separates the block into sub-blocks, where the NAND strings 700n and 710n are in different sub-blocks.

Figure 6:
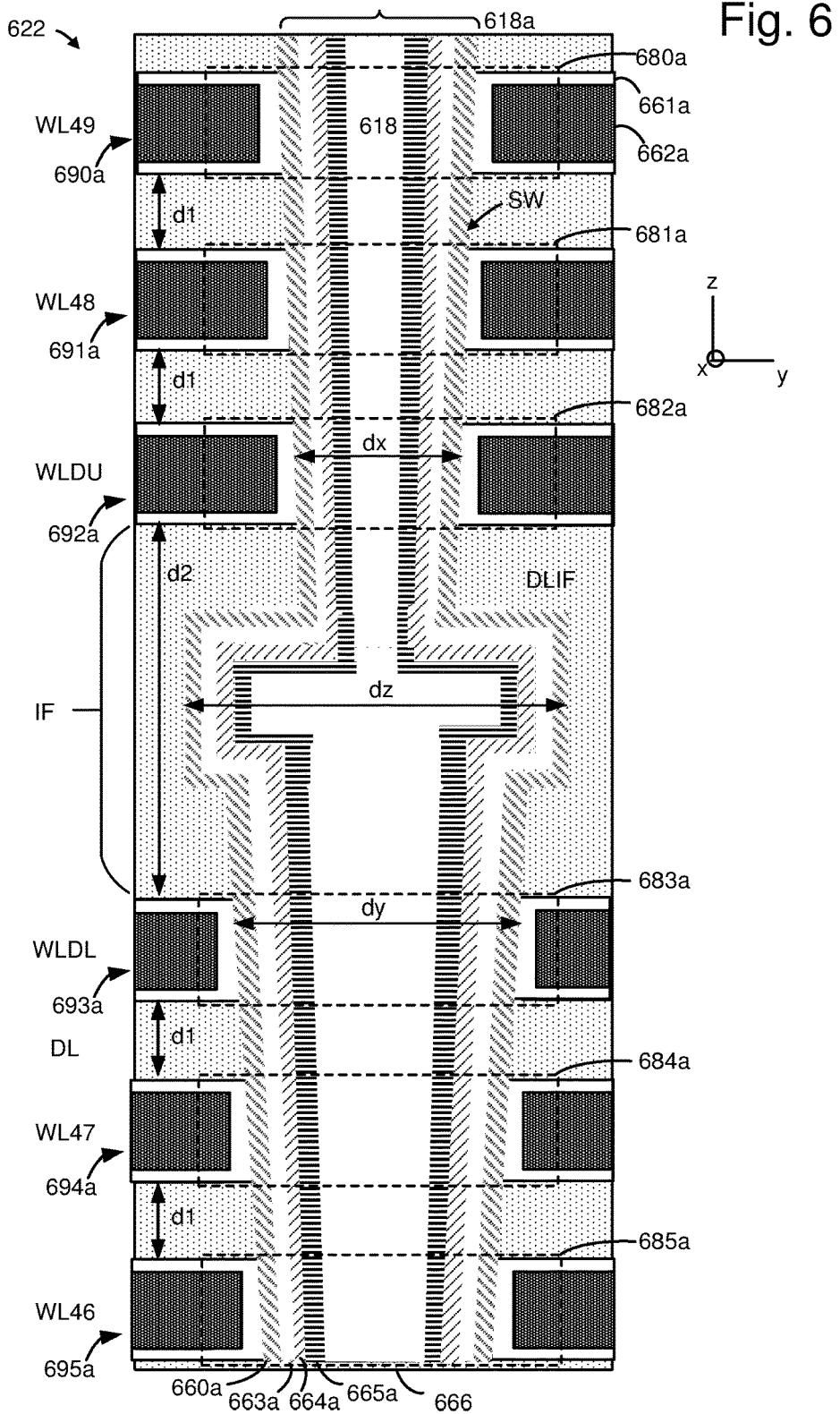
FIG. 6 depicts a close-up view of the region 622 of the stack of FIG. 5.

FIG. 6 depicts a close-up view of the region 622 of the stack of FIG. 5. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 681a, 682a, 683a, 684a and 685a connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another.

The memory cell 682a is connected to WLDU, and is adjacent to and above the interface. The memory cell 683a is connected to WLDL, and is adjacent to and below the interface. These are interface memory cells. The second distance spans the interface. In some cases, the memory cells 682a and 683a can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the bottom tier is larger than the memory hole diameter dx at the bottom word line layer or memory cell in the top tier. A diameter dz represents a widest region of the memory hole. This widened region is used to accommodate small misalignments in the memory hole portion of the top tier relative to the memory hole portion in the bottom tier. The increased thickness d2 of DLIF is provided due to process margin concerns and also accommodates misalignment by providing a transition region between the memory hole portions in the two tiers.

The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride (Si3N4) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

FIG. 7A depicts an example view of NAND strings in sub-blocks in a 3D configuration which is consistent with the two-tier stack of FIG. 5. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end word line and proceeding one word line at a time to WL95, the drain-end data word line.

The NAND strings 700n, 710n, 720n and 730n have channels 700a, 710a, 720a and 730a, respectively. Each channel can extend continuously from a source-end select gate transistor to a drain-end select gate transistor. For example, the channel 700a extends continuously in the NAND strings 700n from the SGS transistor 701 to the SGD transistor 718. The channel 700a is continuous in that it is uninterrupted and can therefore provide a continuous conductive path in the NAND string.

NAND string 700n includes SGS transistor 701, source-side dummy memory cell 702 connected to WLDS, lower tier data memory cells 703-711 connected to WL0-WL47, respectively, interface-adjacent dummy memory cell 712 connected to WLDL, interface-adjacent dummy memory cell 713 connected to WLDU, upper tier data memory cells 714-716 connected to WL48-WL95, respectively, drain-side dummy memory cell 717 connected to WLDD, and SGD transistor 718 connected to SGD(0).

Similarly, NAND string 710n includes SGS transistor 721, source-side dummy memory cell 722 connected to WLDS, lower tier data memory cells 723-731 connected to WL0-WL47, respectively, interface-adjacent dummy memory cell 732 connected to WLDL, interface-adjacent dummy memory cell 733 connected to WLDU, upper tier data memory cells 734-736 connected to WL48-WL95, respectively, drain-side dummy memory cell 737 connected to WLDD, and SGD transistor 738 connected to SGD(1).

NAND string 720n includes SGS transistor 741, source-side dummy memory cell 742 connected to WLDS, lower tier data memory cells 743-751 connected to WL0-WL47, respectively, interface-adjacent dummy memory cell 752 connected to WLDL, interface-adjacent dummy memory cell 753 connected to WLDU, upper tier data memory cells 754-756 connected to WL48-WL95, respectively, drain-side dummy memory cell 757 connected to WLDD, and SGD transistor 758 connected to SGD(2).

NAND string 730n includes SGS transistor 761, source-side dummy memory cell 762 connected to WLDS, lower tier data memory cells 763-771 connected to WL0-WL47, respectively, interface-adjacent dummy memory cell 772 connected to WLDL, interface-adjacent dummy memory cell 773 connected to WLDU, upper tier data memory cells 774-776 connected to WL48-WL95, respectively, drain-side dummy memory cell 777 connected to WLDD, and SGD transistor 778 connected to SGD(3).

In this example, the memory cells 713, 733, 753 and 773 are adjacent to and above the interface, and the memory cells 712, 732, 752 and 772 are adjacent to and below the interface.

FIG. 7B depicts an example transistor 650 which represents any of the memory cells or select gate transistors of FIG. 7A. The transistor comprises a control gate CG, a drain D, a source S and a channel CH and may represent a memory cell or a select gate transistor, for example.

Figure 8:
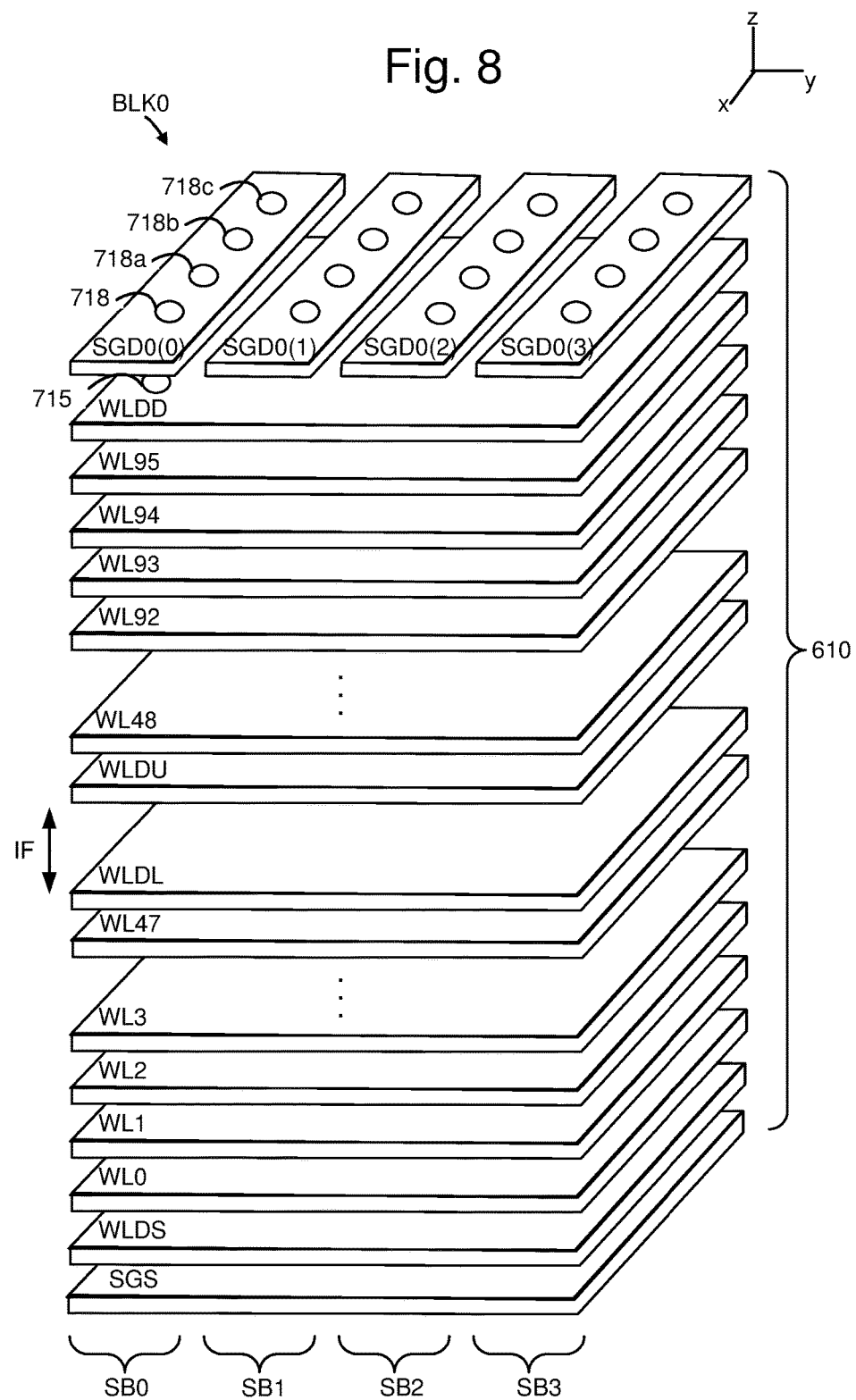
FIG. 8 depicts control gate layers in BLK0 consistent with FIG. 5-7A.

FIG. 8 depicts control gate layers in BLK0 consistent with FIG. 5-7A. The control gate layers are arranged in the stack 610 and include the layers SGS, WLDS, WL0-WL47, WLDL, WLDU, WL48-WL95, WLDD and SGD(0)-SGD (3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 718, 718a, 718b and 718c are depicted in SGD0 (0), and a dummy memory cell 715 is depicted in WLDD.

Figure 9:
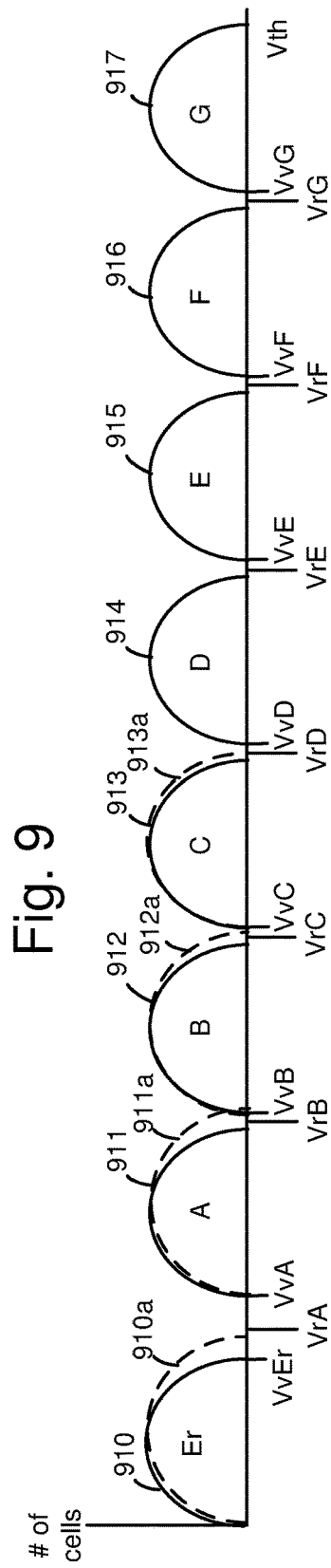
FIG. 9 depicts an example Vth distribution of a set of MLC memory cells in eight data states.

FIG. 9 depicts an example Vth distribution of a set of MLC memory cells in eight data states. The vertical axis depicts a number of memory cells on a logarithmic scale and the horizontal axis depicts the Vth on a linear scale. Initially, at a start of a program operation, the memory cells of a block are all in the erased state, as represented by the Vth distribution 910. In the program operation, the memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

The memory cells assigned to some of the lower data states, in particular, may experience program disturb. For example, the Er, A, B and C states are represented by the Vth distribution 910a, 911a, 912a and 913a, respectively, where the Vth distribution is upshifted due to program disturb as described herein.

In an erase operation, the data memory cells transition from the Vth distributions of the programmed data states, e.g., states A-G, to the erased state. The erase operation includes an erase phase in which the memory cells are biased for erasing followed by an erase-verify test which uses an erase verify voltage, VvEr.

Figure 10A:
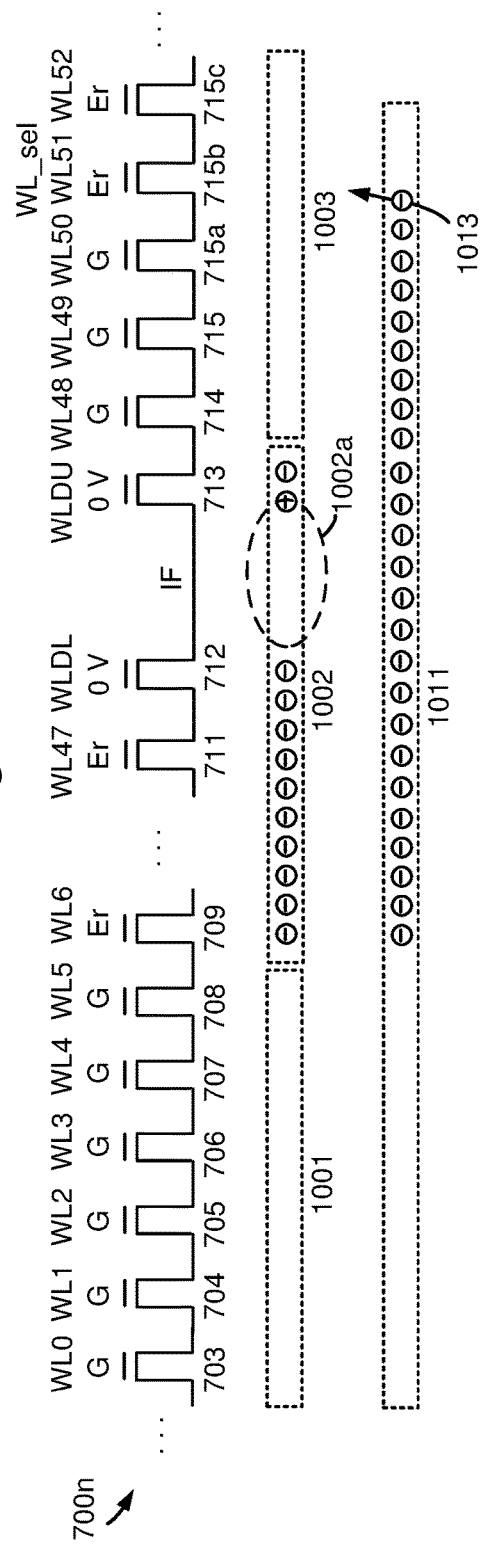
FIG. 10A depicts the NAND string 700n of FIG. 7A, and different configurations of residue electrons in the channel 700a of the NAND string.

FIG. 10A depicts the NAND string 700n of FIG. 7A, and different configurations of residue electrons in the channel 700a of the NAND string. The horizontal direction is a direction along the length of the channel of a NAND string. This may also be the vertical direction in a 3D memory structure. The channel 700a of FIG. 7A is represented by channel regions 1001, 1002 and 1003. A region 1002a of the channel is adjacent to the interface (IF). A portion of the memory cells in the NAND string and the associated word lines are also depicted. This includes the memory cells 703-709 connected to WL0-WL6, respectively, and memory cells 711, 712, 713, 714, 715, 715a, 715b and 715c connected to word lines WL47, WLDL, WLDU, WL48, WL49, WL50, WL51 and WL52, respectively. The memory cells have different data states as depicted. The dummy memory cells 712 and 713 are not programmed to a data state but may have a low Vth such as 0 V.

Data is typically randomly programmed in a block, so that the pattern of data states in a NAND string will vary. From the perspective of program disturb based on electron injection in a two-tier stack, a worst case scenario may occur when a few source side data memory cells at the bottom of the lower tier and a bottom of the upper tier are in a high data state, e.g., the G state, and many consecutive remaining memory cells in the lower tier between these high state memory cells are in the erased state, as shown here. This configuration results in many trapped electrons at the end of a program loop (see FIG. 12 at t13, and FIG. 13 at t12), when the unselected word line voltages decrease from Vpass (e.g., 8-10 V) to 0 V. This voltage decrease causes a down coupling in the channel so that a negative voltage such as −5 V develops under the G state memory cells. The channel voltage is based on the word line voltage minus the Vth. If we assume Vth=5 V for a G state memory cell, the associated channel voltage is 0-5 V=−5 V. Different regions of the channel can have different voltages based on the Vth of the associated memory cell and the control gate or word line voltage of the memory cell.

The decrease of the word line voltages results in a gate-to-channel electric field which encourages some of the electrons to move from the charge trapping material to the channel. However, with the example data pattern described, the channel region 1001 will be in a non-conductive state because the associated memory cells are in the G state. The channel will be cutoff in the lower tier between the memory cells 708 and 709. Similarly, in the upper tier, the channel region 1003 will be in a non-conductive state adjacent to the G state memory cells, resulting in the channel being cutoff between the memory cells 713 and 714.

A memory cell is in a non-conductive state when its control gate voltage does not exceed its Vth. Thus, with Vth=5 V for these high state memory cells and with 0 V as the word line voltage, the high state memory cells will be in a non-conductive state. That is, the associated channel regions will be non-conductive. As a result, the electrons (residue electrons) which are forced into the channel in the channel region 1002 will be trapped. The electrons are represented by a circle with a minus sign in the middle. The channel region 1002a in the interface typically has few electrons at this time.

Subsequently, at the start of the program phase in the next program loop, when the word line voltages increase from 0 V to Vpass, the high state memory cells will become conductive and a continuous channel region 1011 will be formed. At the same time, a positive voltage is applied to the bit line of the unselected NAND strings, so that the residue electrons are attracted to the drain end of the NAND string. However, the conductivity in the channel region 1002a in the interface will be relatively low due to the relatively weak fringing electric field resulting from the large distance between the memory cells 712 and 713. By the time the residue electrons reach the channel region 1003, the word line voltages may have increased to, or close to, their peak level. In particular, when the selected word line (WL51 in this example) is in the upper tier and is at, or close to Vpgm, there is a very strong electric field which attracts the electrons into the charge trapping layer of the memory cell 715b, causing program disturb. For example, an electron 1013 is shown by an arrow as being attracted to the memory cell 715b. Additionally, when the memory cell 715b is in the erased state and adjacent to one or more memory cells 714-715a in the high state, a significant channel gradient is formed in the channel region 1003 which accelerates the electrons, increasing their energy, so that they can more easily move into the charge trapping layer of the memory cell 715b.

The data pattern can vary such that the likelihood of this injection type of program disturb also varies. However, the worst case scenario should be considered as a design criterion. If the selected memory cell is in the lower tier, the likelihood of injection type of program disturb is smaller so that the program disturb countermeasures described herein can be omitted, in one approach.

Figure 10B:
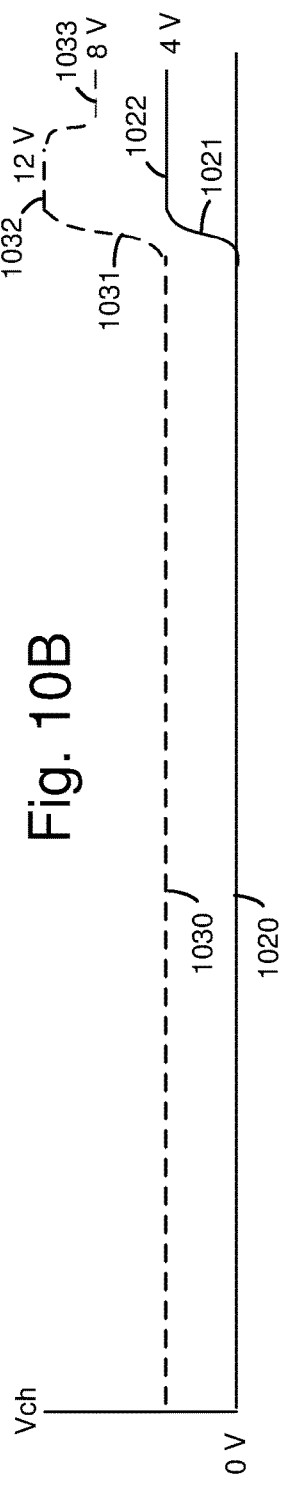
FIG. 10B depicts different configurations of a voltage in the channel 700a, consistent with FIG. 10A.

FIG. 10B depicts different configurations of a voltage in the channel 700a, consistent with FIG. 10A. The vertical axis depicts voltage and the horizontal axis depicts a position along the channel of FIG. 10A. Referring to FIG. 12 at t3, for example, the voltages of the unselected word lines (VWL_unsel) are increased from an initial voltage such as 0 V to a pass voltage, Vpass, in a program phase of a program loop. The pass voltage provides the memory cells in a conductive state so that electrons can travel in the channel to the selected memory cell. As an example, VWL_unsel may increase from 0-10 V. If we assume Vth=5 V for the high state memory cells 703-708 and 714-715a of FIG. 10A, these memory cells will be in a non-conductive state at the moment in which VWL_unsel exceeds 5 V, resulting in the disconnected channel regions 1001-1003. Further, as represented by a plot 1020, the channel voltage (Vch) will be 0 V between memory cells 703-715a at the moment in which VWL unsel=5 V. This Vch is based on the control gate voltage of 5 V minus the Vth of 5 V, multiplied by a gate to channel coupling ratio of 0.8, for example.

At the selected memory cell 715b, assume it is in the erased state with Vth=0 V, for example, and that VWL_sel is increased at the same time as VWL_unsel. In this case, at the moment the word line voltage reaches 5 V, the channel voltage associated with the memory cell 715b and WL51 is (5 V−0 V)×0.8=4 V (plot 1022). The next memory cell 715c is also in the erased state in this example, so that the channel voltage associated with the memory cell 715c and WL52 is also 4 V (plot 1022). A channel gradient of 4 V is represented by a plot 1021.

Once VWL_unsel and VWL_sel reach 10 V, the channel voltages are shifted higher accordingly as represented by the dashed line. For the high state memory cells 703-708, these memory cells will be in a conductive state when VWL_unsel=10 V, resulting in the continuous channel region 1011. Further, as represented by a plot 1030, the channel voltage (Vch) will be (10 V−5 V)×0.8=4 V between memory cells 703-715a. The channel voltage associated with the memory cell 715b will be significantly higher than the level of plot 1022. For example, with VWL_sel=Vpgm such as 15 V, the channel voltage associated with the memory cell 715b is (15 V−0 V)×0.8=12 V (plot 1032). The gate voltage of the next memory cell 715c is 10 V so that Vch will be (10 V−0 V)×0.8=8 V (plot 1033). The channel gradient (plot 1031) is 12 V−4 V=8 V (plot 1031) compared to the channel gradient of 4 V of plot 1021. Since a greater channel gradient will impart a greater amount of energy to the residue electrons in the channel, the likelihood of program disturb is much greater if the residue electrons remain in the channel when VWL_sel has reached a program voltage.

The program disturb countermeasures described herein reduce the likelihood of program disturb by controlling the residue electrons in the lower tier during the program phase of a program loop. As described in FIG. 11A, in one approach, the residue electrons are allowed to move into the upper tier at a relatively early time, when VWL_sel is relatively low, so that any injection disturb which may occur is relatively small. In another approach, the residue electrons are prevented from moving into the upper tier when VWL_sel is increasing to Vpgm, so that the likelihood of injection disturb is reduced.

FIG. 11A depicts an example programming operation for a selected word line, WL_sel, which addresses the problem of residue electrons as discussed in connection with FIGS. 10A and 10B. Step 1100 begins a program operation for a selected word line (WL_sel) of a selected sub-block. This can include setting latches for selected memory cells based on program data. For example, the latches may designate a data state which is assigned to a memory cell. If the data state is the erased state, the latches designate that the memory cell has a lockout status and should be inhibited from programming. If the data state is a programmed state, the latches designate that the memory cell has a program status and should be programmed Step 1101 sets an initial program voltage. See also FIG. 14. Step 1102 begins a program loop for WL_sel. Step 1103 includes performing a pre-charge phase. For example, see the pre-charge phases 1207 and 1287 in FIGS. 12 and 13, respectively. This can involve applying a positive bit line voltage to the drain ends of each of the NAND strings and applying a turn-on voltage to the select gate transistors.

Step 1104 includes performing a program phase. For example, see the program phases 1208 and 1288 in FIGS. 12 and 13, respectively. This can involve reading the latches of the selected memory cells, e.g., to determine whether the memory cells are in a lockout or program state, and applying a corresponding bit line voltage. This can also involve setting a level or timing of VWLDL and/or VWLDU (the voltages of the lower and upper interface unselected word lines, respectively) based on a position of WL_sel. Various options for implementing step 1104 are provided in steps 1104a-1104c.

One option, depicted at step 1104a, involves increasing VWLDL and/or VWLDU to Vpass, then after a delay, increasing voltages of other unselected word lines (e.g., WL0-WL47 and WL48-WL95) to Vpass. See also FIG. 12 and the delay of t4–t3. Vpass represents a general pass voltage which is a voltage which is sufficiently high to place the associated memory cells in a strongly conductive state. Vpass can be the same or different for VWLDL, VWLDU and the other unselected word lines. An example range for Vpass is 8-10 V. Step 1104a may be used, e.g., when WL_sel is in the upper tier, or in the upper tier and at risk for the injection type of program disturb, as discussed below in connection with FIGS. 11B and 11C.

Another option, depicted at step 1104b, involves setting VWLDL and/or VWLDU to 0 V, or another relatively low turn-off voltage which places the associated memory cells in a non-conductive or off state. This step prevents residue electrons from moving in the channel from the lower tier into the upper tier when VWL_sel is increasing to Vpass and Vpgm, so that the likelihood of injection disturb is reduced. This step can also include increasing voltages of adjacent word lines (adjacent to WLDL and/or WLDU) to Vpass_low, which is a voltage between 0 V and Vpass. For example, in FIG. 5, Vpass_low may be set on WL47 and WL48, which are adjacent to WLDL and WLDU, respectively. An example range for Vpass_low is 4-6 V. This approach avoids a large channel gradient which would otherwise occur by setting VWLDL and/or VWLDU to 0 V and setting the voltage on the adjacent word lines (WL47 and WL48) to Vpass, e.g., 8-10 V. Step 1104b also includes increasing voltages of other unselected word lines (e.g., WL0-WL46 and WL49-WL95) to Vpass. See also FIG. 13. Step 1104b may be used as an alternative to step 1104a, e.g., when WL_sel is in the upper tier, or in the upper tier and at risk for the injection type of program disturb, as discussed below in connection with FIGS. 11B and 11C.

Another option, depicted at step 1104c, involves increasing VWLDL and/or VWLDU to Vpass at the same time as increasing the voltages of other unselected word lines (e.g., WL0-WL47 and WL48-WL95) to Vpass. See also FIG. 13. Step 1104c may be used as an alternative to step 1104a or 1104b, e.g., when WL_sel is in the lower tier, or in the upper tier but not at risk for the injection type of program disturb, as discussed below in connection with FIG. 11B. Step 1104c does not implement a program disturb countermeasure.

Step 1105 includes performing a verify phase. For example, see the verify phases 1208 and 1288 in FIGS. 12 and 13, respectively. This can involve performing verify tests for the selected memory cells based on the assigned data state stored in their latches. Further, the latches can be updated based on the result of a verify test to indicate whether the verify test was passed. For example, the latches can be updated from the program state to the lockout state for memory cells which pass a verify test. A decision step 1106 determines if there is a next program loop. A next program loop may be performed if many memory cells have not completed programming, e.g., are in the program state. If this is true, step 1107 includes incrementing Vpgm, and a next program loop begins at step 1102. If decision step 1106 is false, step 1108 denotes the end of the program operation. Subsequently, a program operation may be performed on a next word line and/or sub-block.

Figure 11B:
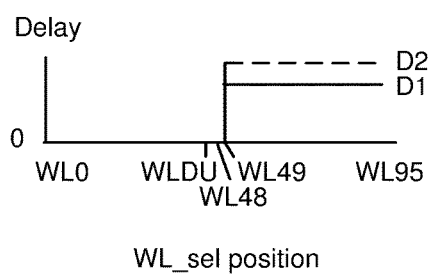
FIG. 11B depicts an example plot of a delay versus a selected word line position, in an implementation of step 1104a of FIG. 11A.

FIG. 11B depicts an example plot of a delay versus a selected word line position (WL_sel position), in an implementation of step 1104a of FIG. 11A. According to step 1104a, the increase in the voltages of the other unselected word lines can be delayed relative to the increase in VWLDL and/or VWLDU. In one approach, there is no delay when WL_sel is in the lower tier (e.g., WL0-WL47). Also, there may be no delay when WL_sel is in the upper tier but not at risk for the injection type of program disturb. Generally, a channel gradient such as depicted by plots 1021 and 1031 in FIG. 10B is not present for one or more word lines adjacent to and above WLDU since WLDU has a low Vth. Accordingly, there is little risk of program disturb for a few (one or more) word lines (e.g., 1-3 word lines) adjacent to and above WLDU. For example, there is little risk of program disturb for WL48-WL50. The plot of FIG. 11B assumes there is little risk of program disturb for the one word lines (e.g., WL48) which is adjacent to and above WLDU, so that no delay is implemented when WL_sel<=WL48 and a delay is implemented when WL_sel>=WL49. The countermeasure determination circuit 119 of FIG. 1A can decide whether to implement the delay.

When the selected word line is above these one or more word lines at the bottom of the upper tier, the delay can be implemented, in one approach. For example, the delay can be implemented when WL_sel is from WL49-WL95. This approach avoids the time penalty of the delay at other times when programming other word lines. WL49-WL95 are considered to be word lines in the upper tier which are at risk for the injection type of program disturb, in one approach, although see also FIG. 11C.

In one approach, a determination is made as to whether the selected word line is in the upper tier and there are at least one or more data word lines (at least a specified number of data word lines) between the interface and the selected word line. If this determination is true, the countermeasures of steps 1004a or 1104b can be implemented. If this determination is false, the countermeasures of steps 1004a or 1104b can be omitted and step 1104c followed instead.

In another implementation, a control circuit is configured to increase the voltage of the unselected word line adjacent to the interface (WLDU) earlier than the increase of the voltage of the unselected word lines non-adjacent to the interface (e.g., WL48-WL95) in response to a determination that the selected word line is in the upper tier.

Additionally, the magnitude of the delay can be relatively larger when the temperature is relatively higher. That is, the magnitude of the delay can be an increasing function of the temperature. This is appropriate since the energy of the residue electrons is greater when the temperature is higher, so that the likelihood of program disturb is also greater. A larger delay allows more time for the residue electrons to pass through the interface and toward the bit line before WL_sel is increased to Vpass and/or Vpgm, thus reducing the likelihood of the injection type of program disturb. In one approach, the delay is a relatively low value (D1) when the temperature is below a specified level, and a relatively high value (D2>D1) when the temperature is at or above the specified level. In another approach, the delay is increased progressively according to a ramp function or a stepped function with two or more steps as the temperature increases.

Figure 11C:
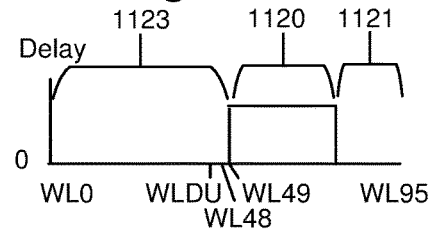
FIG. 11C depicts an example plot of a delay versus a selected word line position (WL_sel position), in another implementation of step 1104a of FIG. 11A.

FIG. 11C depicts an example plot of a delay versus a selected word line position (WL_sel position), in another implementation of step 1104a of FIG. 11A. In this case, the delay is not implemented when the selected word line is among a group of adjacent word lines 1121 at the top of the stack (at the top of the upper tier). This approach is based on an assumption that the worst case data pattern of FIG. 10A, which involves a long sequence of erased-state memory cells between high state memory cells, becomes increasingly unlikely as the selected word line is further above the interface. That is, injection disturb may occur mainly in the lower to midrange word lines, but not on upper range word lines, of the upper tier. As a result, an injection disturb countermeasure can be implemented when the selected word line is among a group of adjacent word lines 1120 at the bottom of the upper tier but not in the group of adjacent word lines 1121 at the top of the upper tier. The injection disturb countermeasure can be implemented consistent with step 1104a or 1104b, for instance. The injection disturb countermeasure can be omitted when the selected word line is among a group of word lines 1123 which includes the data word lines in the lower tier and one or more data word lines in the upper tier adjacent to WLDU, consistent with step 1104c.

As an example, the group of adjacent word lines 1120 may comprise at least one-half, 60%, two-thirds or three-quarters of the data word lines of the upper tier, and the group of adjacent word lines 1121 may comprise no more than one-half, 40%, one-third or one-quarter, respectively, of the data word lines of the upper tier.

In one approach, a control circuit is configured to implement a program disturb countermeasure based on a determination that the selected word line is in the bottom half of the upper tier. The implementation can include increasing the voltage of the unselected word line adjacent to the interface earlier than the increase of the voltage of the unselected word line non-adjacent to the interface, consistent with step 1104a. In another embodiment, the implementation can include maintaining the voltage of the unselected word line adjacent to the interface at a turn-off voltage during the program phase, consistent with step 1104b.

Figure 13:
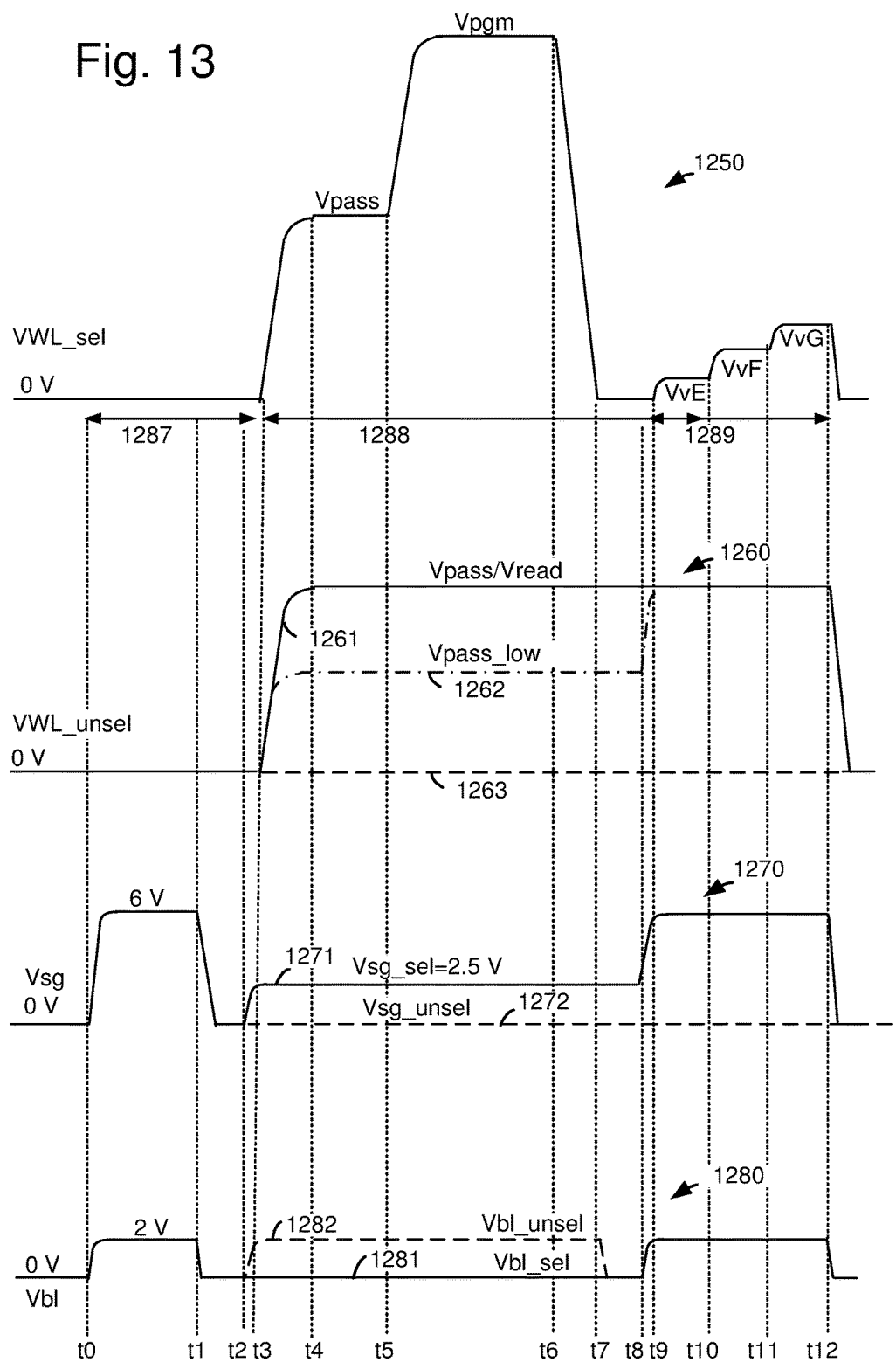
FIG. 13 depicts examples of voltage signals which can be used in a program loop of a program operation, consistent with steps 1104b and 1104c of FIG. 11A.

FIG. 12 depicts examples of voltage signals which can be used in a program loop of a program operation, consistent with step 1104a of FIG. 11A. In FIGS. 12 and 13, the vertical dimension denotes voltage and the horizontal dimension denotes time, with time points t0-t13 and t0-t12, respectively. The period of time depicted corresponds to one program loop and includes a pre-charge phase 1207 (t0-t3), a program phase 1208 (t3-t9) and a verify phase 1209 (t9-t13). A voltage signal 1200 represents VWL_sel, the voltage of the selected word line, a voltage signal 1210 represents VWL_unsel, a voltage of unselected word lines, a voltage signal 1220 represent the select gate voltages, e.g., Vsgd and/or Vsgs, and a voltage signal 1230 represents Vbl, a bit line voltage.

VWL_sel is at an initial voltage such as 0 V during the pre-charge phase. VWL_sel then increases from the initial voltage to an intermediate value, e.g., Vpass, starting at t4, in a time period t4-t5, and is held at Vpass from t5-t6. VWL_sel then increases from Vpass to Vpgm starting at t6, and is held at Vpgm until t7. VWL_sel then decreases from Vpgm back to the initial voltage starting at t7 and is held at the initial voltage until t10. During the verify phase, VWL_sel increases in steps to one or more verify voltages. For example, VWL_sel may increase to VvE at t10, from VvE to VvF at t11, from VvF to VvG at t12 and from VvG back to the initial voltage at t13.

The voltage signal 1210 represents the voltage of the interface word lines, VWLDL and VWLDU, at plot 1211, and the voltages of the remaining unselected (non-interface) word lines, VWL0-VWL47 and VWL48-VWL95, at plot 1212, in one approach. In another approach, plot 1211 depicts VWLDL and VWLDU as well as the voltage of a small number of data word lines, e.g., VWL48 at the bottom of the upper tier, as mentioned in connection with FIG. 11B. Plot 1212 then depicts the voltages of the remaining unselected word lines, VWL0-VWL47 and VWL49-VWL95. The notation VWLi, where i=0, 1, 2 . . . refers to the voltage of an ith word line in the stack.

In one implementation, the increase in VWLDL and VWLDU starts at t3, and the increase in the voltages of the remaining unselected (non-interface) word lines starts at t4, so that there is a delay of t4-t3. In one approach, the delay is great enough so that VWLDL and VWLDU reach their peak voltage of Vpass before the increase in the voltages of the remaining unselected word lines starts at t4. This ensures that the channel region in the interface is at its peak conductivity to allow movement of the residue electrons to the upper tier for some period of time before the voltages of the remaining unselected word lines are increased.

In one approach, the pass voltages of the interface unselected word lines (WLDL and WLDU) are higher than the pass voltages of the non-interface unselected word lines (WL0-WL47 and WL48-WL95), to provide a greater fringing field in the interface. For example, VWLDL and VWLDU can be 11 V and VWL0-VWL47 and VWL48-VWL95 can be 9-10 V.

The voltage signal 1220 represents the select gate voltages including the select gate voltage Vsg_sel for a selected sub-block (plot 1221) and the select gate voltage Vsg_unsel for an unselected sub-block (plot 1222). A selected sub-block comprises selected memory cells and an unselected sub-block comprises only unselected memory cells.

The voltage signal 1230 represents the bit line voltages including the voltage Vbl_sel for selected bit lines (plot 1231) and the voltage Vbl_unsel for unselected bit lines (plot 1232). A selected bit line is connected to a selected NAND string (comprising a selected memory cell connected to the selected word line) and an unselected bit line is connected to an unselected NAND string (comprising an unselected memory cell connected to the selected word line).

In the pre-charge phase, a positive Vbl, e.g., 2 V, is provided to the drain-side of the channels of the NAND strings to remove residue electrons in the upper tier and to provide a small amount of boosting such as 1-2 V. The SGD transistors of the selected and unselected sub-blocks are in a conductive state at this time, with a voltage of 6 V, for example. This allows the bit line voltage to be passed to the drain end of the channel. The SGS transistors of the selected and unselected sub-blocks may also be in a conductive state at this time, with a voltage of 6 V, for example, to allow the source line voltage (Vsl) to be passed to the source end of the channel.

In the program phase, VWLDL and VWLDU are ramped up, e.g., starting at t3, to provide the associated memory cells in a conductive state and to provide a capacitive coupling up of the associated channel regions of the unselected NAND strings. VWL_sel and the voltages of the remaining word lines are ramped up at t4 to provide the associated memory cells in a conductive state and to provide a capacitive coupling up of the associated channel regions of the unselected NAND strings. VWL_sel is then ramped up further at t6 to the peak program voltage of Vpgm and held at Vpgm until t7 to provide a strong gate-to-channel voltage for the selected memory cells which programs them.

In the verify phase, one or more verify tests are performed by applying one or more control gate read voltages on WL_sel, for each read voltage, sensing the conductive state of the memory cells in the selected NAND strings of the selected sub-block. VWL_unsel may be the same in the verify phase as the program phase, in one approach. This voltage is referred to as Vread in the verify phase and Vpass in the program phase.

During the program and verify phases, Vsg_sel can be set to, e.g., 2.5 V and 0 V, respectively, for the selected sub-block (plot 1221) and the unselected sub-blocks (plot 1222). During the program pulse, with Vbl_sel=0 V (plot 1231), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings. Vbl_sel can be increased during the verify phase as part of a sensing process in which the bit lines are charged up. Vbl_unsel can also be increased in some cases.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a turn-off voltage such as 0 V which provides the SG_unsel transistors in a non-conductive or off state for the NAND strings in the unselected sub-blocks. After the verify phase, at t13, Vbl is decreased to 0 V so that the SGD transistors are cutoff and the channel region has a floating voltage.

FIG. 13 depicts examples of voltage signals which can be used in a program loop of a program operation, consistent with steps 1104b and 1104c of FIG. 11A. The period of time depicted corresponds to one program loop and includes a pre-charge phase 1287 (t0-t3), a program phase 1288 (t3-t9) and a verify phase 1289 (t9-t12). Voltage signals 1250, 1260, 1270 and 1280 represent VWL_sel, VWL_unsel, the select gate voltages and Vbl, respectively.

During the pre-charge phase, the voltages are the same as in FIG. 12. VWL_sel is at an initial voltage such as 0 V during the pre-charge phase. VWL_sel then increases from the initial voltage to Vpass, starting at t3, in a time period t3-t4, and is held at Vpass from t4-t5. VWL_sel then increases from Vpass to Vpgm starting at t5, and is held at a peak voltage Vpgm until t6. VWL_sel then decreases from Vpgm back to the initial voltage starting at t6 and is held at the initial voltage until t9. During the verify phase, VWL_sel increases in steps to one or more verify voltages. For example, VWL_sel may increase to VvE at t9, from VvE to VvF at t10, from VvF to VvG at t11 and from VvG back to the initial voltage at t12.

When implementing the countermeasure of step 1104b, the voltage signal 1260 represents VWLDL and VWLDU at plot 1263, the voltages of the adjacent word lines VWL47 and VWL48 at plot 1262, and the voltages of the remaining unselected word lines, VWL0-VWL46 and VWL49-VWL95 at plot 1261.

The increase in the word line voltages is concurrent at t3. However, VWL47 and VWL48 are increased to a voltage of Vpass_low, which is less than the nominal pass voltage, Vpass. This helps reduce a channel gradient between WL47 and WLDL, and between WLDU and WL48, to reduce the likelihood of program disturb in the associated memory cells.

Note that there could be a set of multiple adjacent dummy word lines above and/or below the interface. In this case, VWLDL and VWLDU could be the voltages of each of the adjacent dummy word lines below and/or above the interface, respectively.

In one approach, a control circuit is configured to increase a voltage of another unselected word line (e.g., WL48) which is adjacent to the unselected word line (e.g., WLDU) adjacent to the interface from an initial voltage to a voltage (Vpass_low) which is lower than a pass voltage (Vpass) to which an unselected word line (e.g., WL49-WL95) non-adjacent to the interface is increased, while the voltage of the unselected word line adjacent to the interface is maintained at the turn-off voltage. Also, the increase in the voltage of the another unselected word line can be concurrent with the increase in the voltage of the unselected word line adjacent to the interface.

The voltages of the adjacent word lines VWL47 and VWL48 are increased from Vpass_low to Vpass at t8 for the verify phase to allow sensing to occur in WL_sel.

The voltage signal 1270 represents the select gate voltages including the select gate voltage Vsg_sel for a selected sub-block (plot 1271) and the select gate voltage Vsg_unsel for an unselected sub-block (plot 1272).

The voltage signal 1280 represents the bit line voltages including the voltage Vbl_sel for selected bit lines (plot 1281) and the voltage Vbl_unsel for unselected bit lines (plot 1282).

In the program phase, the word line voltages are ramped up, e.g., starting at t3, to provide the associated memory cells in a conductive state and to provide a capacitive coupling up of the associated channel regions of the unselected NAND strings. VWL_sel is then ramped up further at t5 to the peak program voltage of Vpgm and held at Vpgm until t6 to program the selected memory cells.

During the program and verify phases, Vsg_sel can be set to, e.g., 2.5 V and 0 V, respectively, for the selected sub-block (plot 1271) and the unselected sub-blocks (plot 1272). During the program pulse, with Vbl_sel=0 V (plot 1281), Vbl_unsel can remain high at 2 V. Vbl_sel can be increased during the verify phase as part of a sensing process in which the bit lines are charged up. Vbl_unsel can also be increased in some cases.

As mentioned, Vpass represents a general pass voltage which is a voltage which is sufficiently high to place the associated memory cells in a strongly conductive state. Vpass can be the same or different for various unselected word lines.

In one approach, the pass voltage of the interface unselected word line above the interface is lower than the pass voltage of the interface unselected word line below the interface, to account for a narrower memory hole diameter. Specifically, Vpass is different for WLDL and WLDU based on the fact that WLDU is adjacent to relatively narrow portion of the memory hole (e.g., with a diameter dx) and WLDL is adjacent to relatively wide portion of the memory hole (e.g., with a diameter dy), as shown in FIG. 6. With a wider memory hole diameter, a greater Vpass is needed to provide the same electric field as with a narrower memory hole diameter. Accordingly, a greater Vpass can be used for WLDL compared to WLDU, e.g., 10 V vs. 8-9 V.

In another approach, the pass voltages of the non-interface unselected word lines are different in different tiers.

When implementing step 1104c, which does not involve a countermeasure, the voltages of each of the unselected word lines can be increase to Vpass at the same time as depicted by plot 1216 and plots 1262 and 1263 are not used.

FIG. 14 depicts a voltage signal used in a series of program loops in an example program operation for MLC memory cells which results in the Vth distribution of FIG. 9. The horizontal axis denotes a program loop number, and the vertical axis denotes voltage. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1400 includes a series of program voltages, including an initial program voltage 1401, which are applied to a word line selected for programming In this example, the voltage signal includes program voltages which increase stepwise in amplitude in one or more program loops of a programming pass using a fixed or varying step size. This is referred to as incremental step pulse programming, where the program voltage starts at an initial voltage (see program voltage 1401) and increases in a step in each successive program loop, for instance, until the program operation is completed. The operation is successfully completed when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1402, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. See also the verify phase of FIGS. 12 and 13.

All memory cells may initially be in the erased state at the beginning of the program operation, for instance. After the program operation is completed, the data can be read from the memory cells using read voltages which are between the Vth distributions. At the same time, a read pass voltage, Vread (e.g., 8-10 V), also referred to as pass voltage or turn-on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 15:
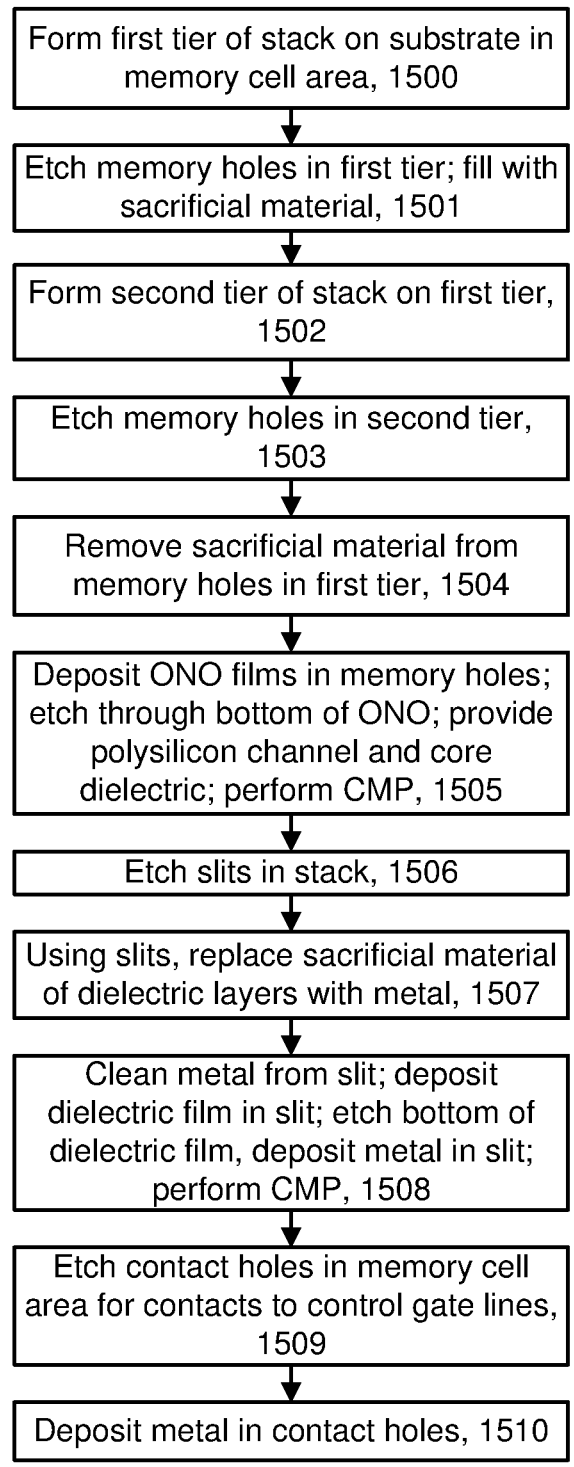
FIG. 15 depicts an example fabrication process for a semiconductor stack comprising two tiers, consistent with FIG. 5-8.

FIG. 15 depicts an example fabrication process for a semiconductor stack comprising two tiers, consistent with FIG. 5-8. The process can be extended to form more than two tiers. Step 1500 includes forming a lower tier of a stack on a substrate in a memory cell area. Step 1501 includes etching memory holes in the lower tier, and filling the memory holes with a sacrificial material, such as SiN. See, e.g., FIG. 16A.

Step 1502 includes forming an upper tier of the stack on the lower tier. Step 1503 includes etching memory holes in the upper tier. See, e.g., FIG. 16B. Step 1504 includes removing the sacrificial material from the memory holes in the lower tier, e.g., using a wet etch. See, e.g., FIG. 16C.

Step 1505 includes depositing oxide-nitride oxide (ONO) films in the memory holes. See, e.g., FIG. 16D. Step 1506 includes etching slits in the stack. See, e.g., FIG. 16E. Step 1507 includes using the slits to replace the sacrificial material of the dielectric layers of the stack with metal. This can involve providing an etchant via the slit which removes the sacrificial material, creating voids, then providing metal via the slit which fills the voids.

Step 1508 includes cleaning metal from the slit, depositing a dielectric film in the slit which coast the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 16F.

Step 1509 includes etching contact holes in the memory cell area for contacts to the control gate lines. See, e.g., FIG. 16G. Step 1510 includes depositing metal in the contact holes. See, e.g., FIG. 16G.

Note that some of the steps can be performed in a different order than the order shown in FIG. 15.

Figure 16A:
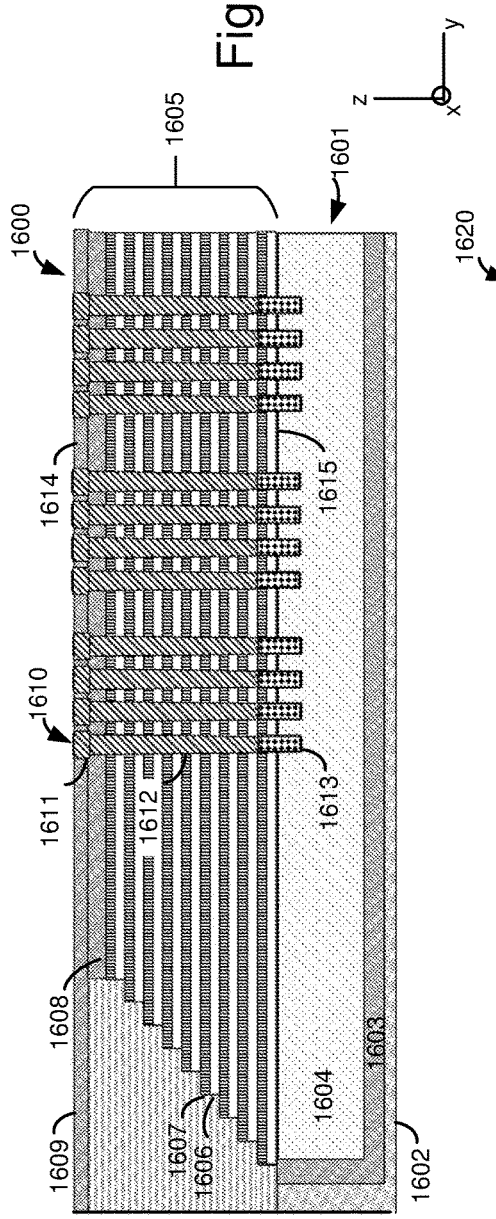
FIG. 16A depicts a semiconductor structure in a configuration which is consistent with steps 1500 and 1501 of FIG. 15.

FIG. 16A depicts a semiconductor structure 1600 in a configuration which is consistent with steps 1500 and 1501 of FIG. 15. The structure includes a memory cell area of a substrate 1601. A peripheral area, not shown, may also be fabricated at the same time. The substrate comprises an intrinsic silicon region 1602, a deep n-well 1603 and a p-well 1604, for instance. A lower tier 1605 of a stack includes alternating dielectric layers and control gate layers. The control gate layers may comprise a sacrificial material at this stage of the fabrication. An example dielectric layer 1606 and an example control gate layer 1607 are depicted. This example includes nine control gate layers in the tier. A dielectric layer 1608 extends on top of the stack while a dielectric layer 1609 extends on top of the semiconductor structure. The dielectric layer 1608 may be, e.g., SiOx deposited by LPCVD or PECVD, for instance. The dielectric layer 1609 may be, e.g., SiN deposited by low pressure chemical vapor deposition (LPCVD) or plasma-enhanced chemical vapor deposition (PECVD), for instance.

The semiconductor structure includes a plurality of memory holes which are etched in the tier. An example memory hole 1610 (also referred to as a column or pillar when the memory hole is filled) includes a widened top portion 1611 above an elongated portion 1612. A source side region 1613 is below the memory hole. A top 1614 and a bottom 1615 of the stack are also depicted. A coordinate system shows x, y and z (vertical) directions.

Figure 16B:
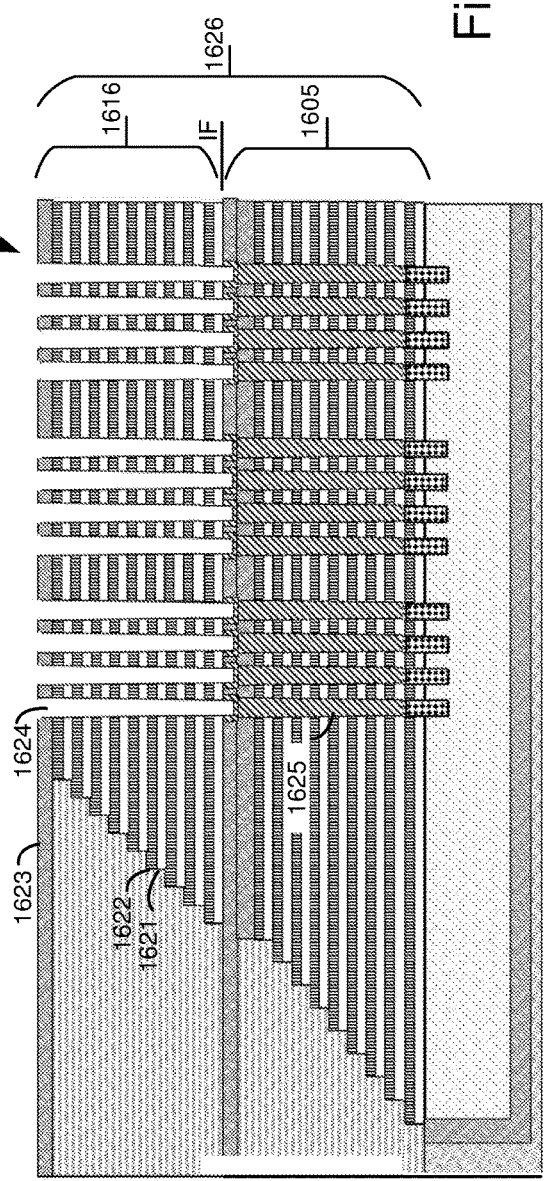
FIG. 16B depicts a semiconductor structure in a configuration which is consistent with steps 1502 and 1503 of FIG. 15.

FIG. 16B depicts a semiconductor structure 1620 in a configuration which is consistent with steps 1502 and 1503 of FIG. 15. A second (top) tier 1616 of the stack is formed on the lower tier and also includes alternating dielectric layers and control gate layers. An interface IF at the top of the lower tier separates the top and bottom tiers. An example dielectric layer 1621 and an example control gate layer 1622 are depicted. This example includes nine control gate layers in the tier. A dielectric layer 1623 extends on top of the semiconductor structure 1620 which comprises a stack 1626 of alternating dielectric layers and control gate layers.

Memory holes, including an example memory hole 1624 are etched in the upper tier of the stack. These memory holes are aligned with the sacrificial material in the memory holes in the lower tier (e.g., example sacrificial material 1625). In some cases there is a misalignment between the memory holes in the top and bottom tiers. The widened top portion 1611 provides an increased area for the memory hole in the top tier to contact, to ensure that the memory holes are connected to provide a continuous memory hole through both tiers.

FIG. 16C depicts a semiconductor structure 1630 in a configuration which is consistent with step 1504 of FIG. 15. Once the sacrificial material in the lower tier is removed, continuous memory holes, such as an example continuous memory hole 1631, are formed which extend through both tiers, from the top of the stack to the bottom of the stack. The continuous memory hole 1631 comprises the memory hole 1632 (or memory hole portion) of the lower tier and the memory hole 1624 (or memory hole portion) of the upper tier.

FIG. 16D depicts a semiconductor structure 1640 in a configuration which is consistent with step 1505 of FIG. 15. The memory holes are filled with materials such as ONO films, a polysilicon channel and a core dielectric. To provide the polysilicon channel, amorphous silicon may be deposited follow by a heating step. This results in a column 1641 (e.g., pillar) comprising a column 1642 in the upper tier above a column 1643 in the lower tier.

Figure 16E:
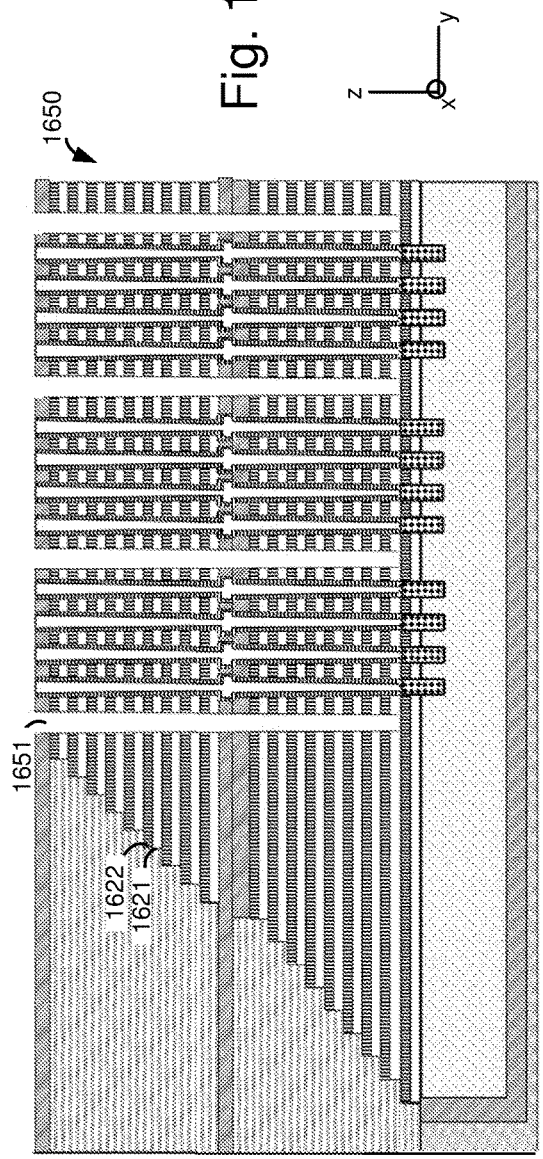
FIG. 16E depicts a semiconductor structure in a configuration which is consistent with step 1506 of FIG. 15.

FIG. 16E depicts a semiconductor structure 1650 in a configuration which is consistent with step 1506 of FIG. 15. Slits, including an example slit 1651, are formed periodically in the y direction in the stack. Each slit may have a uniform cross-section in the y-z plane and extend across the stack in the x direction.

Figure 16F:
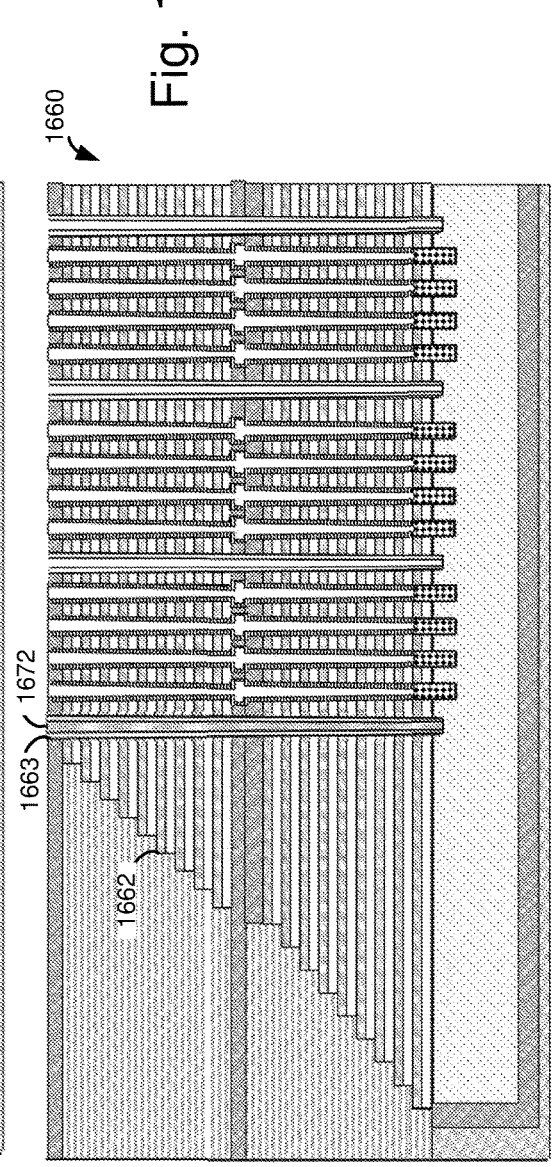
FIG. 16F depicts a semiconductor structure in a configuration which is consistent with steps 1507 and 1508 of FIG. 15.

FIG. 16F depicts a semiconductor structure 1660 in a configuration which is consistent with steps 1507 and 1508 of FIG. 15. By providing an etchant in the slits, the sacrificial material of the control gate layers is removed. Voids created in the control gate layers are subsequently filled with a metal such as tungsten. For example, a metal (e.g., conductive layer) is provided for the control gate layer 1622. A metal residual is then removed from the slits and a dielectric film 1663 is deposited in the slits, leaving a void in the slit. The void may extend from the p-well at a bottom of the stack to the top of the stack. The slit may be filled with a metal 1672 which provides a metal interconnect to the substrate.

Figure 16G:
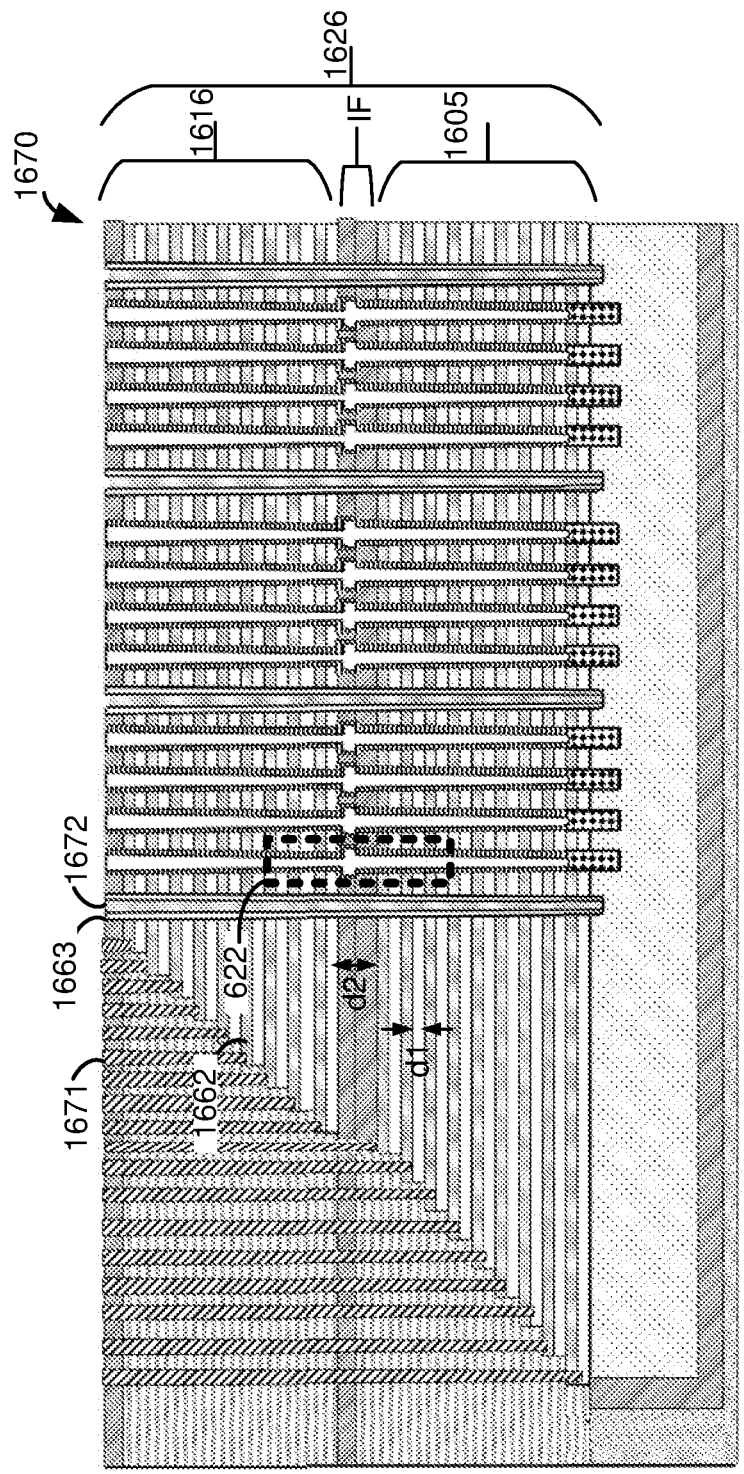
FIG. 16G depicts a semiconductor structure in a configuration which is consistent with steps 1509 and 1510 of FIG. 15.

FIG. 16G depicts a semiconductor structure 1670 in a configuration which is consistent with steps 1509 and 1510 of FIG. 15. Contacts holes are etched in the stack outside the area with the memory holes to provide voids which extend upward from terraced edges of control gate layers to the top of the stack. The contact holes are then filled with metal to provide metal vias which connect the control gate layers to the top of the stack. Subsequent processing involves connected metal paths above the stack to the contacts. The metal paths may in turn be connected to voltage sources, for example, or other circuitry. An example via 1671 is connected to the control gate layer 1662. The distances d1 and d2 between memory cells, discussed previously, are also depicted. See FIG. 6 for a close-up view of the region 622 of the stack.

The semiconductor structure is an example of a three-dimensional structure in which memory cells are arranged in NAND strings.

The stack comprises a plurality of alternating conductive and dielectric layers. The conductive layers are connected to control gates of memory cells and other transistors such as SGD and SGS transistors in each NAND string. In one approach, the conductive layers and associated memory cells in the top and bottom tiers are separate by a distance d1. The conductive layers and associated memory cells which are adjacent to the interface may be separate from one another by a larger distance d2.

In one implementation, an apparatus comprises: a NAND string extending in a lower tier and an upper tier of a stack, the lower tier separated from the upper tier by an interface, the NAND string comprising memory cells connected to respective word lines; and a control circuit configured to, in a program phase of a program loop, increase a voltage of a selected word line from an initial voltage to a program voltage, increase a voltage of an unselected word line non-adjacent to the interface from an initial voltage to a pass voltage, and, based on a position of the selected word line in the stack, set a voltage of an unselected word line adjacent to the interface.

In another implementation, a method comprises, in a program phase of a program loop: increasing a voltage of a selected word line from an initial voltage to a program voltage, the selected word line is in a set of word lines which comprises word lines in a lower tier of a stack and word lines in an upper tier of the stack, and an interface is between the lower tier and the upper tier; increasing a voltage of unselected word lines non-adjacent to the interface to a pass voltage; and setting a voltage of unselected word lines adjacent to the interface based on whether the selected word line is in the upper tier or the lower tier.

In another implementation, an apparatus comprises: a NAND string comprising a plurality of memory cells, the NAND string extends vertically in a stack of alternating conductive layers and dielectric layers, wherein the conductive layers are connected to control gates of the plurality of memory cells, and a height of one dielectric layer (e.g., the interface layer, IF) is greater than a height of other dielectric layers; means for determining that a selected memory cell is connected to a conductive layer which is above the one dielectric layer; and means for biasing conductive layers adjacent to the one dielectric layer differently than conductive layers non-adjacent to the one dielectric layer during programming of a selected memory cell, based on the means for determining.

The means for determining may include the controller 122 and control circuitry 110, of FIG. 1, or other logic hardware, and/or other executable code stored on a computer readable storage medium or device. Other embodiments may include similar or equivalent means.

The means for biasing may include the controller 122, control circuitry 110, the power control module 116 including the voltage timing circuit 117, and the word line drivers 447, 448, 449 and 451 of FIG. 1-3, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a NAND string extending in a lower tier and an upper tier of a stack, the lower tier separated from the upper tier by an interface, the NAND string comprising memory cells connected to respective word lines; and
a control circuit configured to, in a program phase of a program loop, increase a voltage of a selected word line from an initial voltage to a program voltage, increase a voltage of an unselected word line non-adjacent to the interface from an initial voltage to a pass voltage, and, based on a position of the selected word line in the stack, set a voltage of an unselected word line adjacent to the interface.

2. The apparatus of claim 1, wherein:
the control circuit is configured to increase the voltage of the unselected word line adjacent to the interface earlier than the increase of the voltage of the unselected word line non-adjacent to the interface based on a determination that the selected word line is in a bottom half of the upper tier.

3. The apparatus of claim 1, wherein:
the control circuit is configured to increase the voltage of the unselected word line adjacent to the interface earlier than the increase of the voltage of the unselected word line non-adjacent to the interface based on a determination that the selected word line is in the upper tier.

4. The apparatus of claim 3, wherein:
the control circuit is configured to increase the voltage of the unselected word line adjacent to the interface earlier than the increase of the voltage of the unselected word line non-adjacent to the interface based on a determination that the program loop is after a first program loop in a program operation.

5. The apparatus of claim 3, wherein:
the NAND string extends in a memory hole;
the unselected word line adjacent to the interface is adjacent to a relatively narrow portion of the memory hole;

the voltage of the unselected word line adjacent to the interface is increased to a pass voltage which is lower than a pass voltage to which another unselected word line is increased; and
the another unselected word line is adjacent to the interface and adjacent to a relatively wide portion of the memory hole.

6. The apparatus of claim 3, wherein:
the increase in the voltage of the unselected word line adjacent to the interface is to a pass voltage which is greater than the pass voltage to which the voltage of the unselected word line non-adjacent to the interface is increased.

7. The apparatus of claim 1, wherein:
the control circuit is configured to increase the voltage of the unselected word line adjacent to the interface concurrent with the increase of the voltage of the unselected word line non-adjacent to the interface based on a determination that the selected word line is in the lower tier.

8. The apparatus of claim 1, wherein:
the control circuit is configured to maintain the voltage of the unselected word line adjacent to the interface at a turn-off voltage during the program phase based on a determination that the selected word line is in a bottom half of the upper tier.

9. The apparatus of claim 1, wherein:
the control circuit is configured to maintain the voltage of the unselected word line adjacent to the interface at a turn-off voltage during the program phase based on a determination that the selected word line is in the upper tier.

10. The apparatus of claim 9, wherein during the program phase:
the control circuit is configured to increase a voltage of another unselected word line which is adjacent to the unselected word line adjacent to the interface from an initial voltage to a voltage which is lower than the pass voltage, while the voltage of the unselected word line adjacent to the interface is maintained at the turn-off voltage.

11. The apparatus of claim 10, wherein:
the increase in the voltage of the unselected word line adjacent to the interface is concurrent with the increase in the voltage of the another unselected word line.

12. The apparatus of claim 1, wherein:
the unselected word line adjacent to the interface is above the interface; and
a distance between the unselected word line adjacent to the interface and another unselected word line adjacent and below to the interface is at least twice a distance between remaining word lines of the respective word lines.

13. A method, comprising, in a program phase of a program loop:
increasing a voltage of a selected word line from an initial voltage to a program voltage, the selected word line is in a set of word lines which comprises word lines in a lower tier of a stack and word lines in an upper tier of the stack, and an interface is between the lower tier and the upper tier;
increasing a voltage of unselected word lines non-adjacent to the interface to a pass voltage; and
setting a voltage of unselected word lines adjacent to the interface based on whether the selected word line is in the upper tier or the lower tier, wherein, when the selected word line is in the lower tier, the voltage of the unselected word lines adjacent to the interface is increased to the pass voltage concurrent with the increasing of the voltage of the unselected word lines non-adjacent to the interface to the pass voltage.

14. The method of claim 13, further comprising:
when the selected word line is in the upper tier, increasing the voltage of the unselected word lines adjacent to the interface to the pass voltage before the increasing the voltage of the unselected word lines non-adjacent to the interface to the pass voltage.

15. The method of claim 13, further comprising:
when the selected word line is in the upper tier, maintaining the voltage of the unselected word lines adjacent to the interface at a turn-off voltage which provides associated memory cells in a non-conductive state throughout the program phase, wherein the turn-off voltage is lower than the pass voltage.

16. An apparatus, comprising:
a NAND string comprising a plurality of memory cells, the NAND string extends vertically in a stack of alternating conductive layers and dielectric layers, wherein the conductive layers are connected to control gates of the plurality of memory cells, and a height of one dielectric layer is greater than a height of other dielectric layers;
means for determining that a selected memory cell is connected to a conductive layer which is above the one dielectric layer; and
means for biasing conductive layers adjacent to the one dielectric layer differently than conductive layers non-adjacent to the one dielectric layer during programming of a selected memory cell, based on the means for determining.

17. The apparatus of claim 16, wherein:
the means for biasing increases a voltage from an initial voltage to a pass voltage for the conductive layers adjacent to the one dielectric layer earlier than an increase of a voltage from the initial voltage to the pass voltage for the conductive layers non-adjacent to the one dielectric layer.

18. The apparatus of claim 16, wherein:
the means for biasing grounds a voltage for the conductive layers adjacent to the one dielectric layer while a program pulse is applied to the selected memory cell.

19. The apparatus of claim 16, wherein:
the conductive layers adjacent to the one dielectric layer comprise a conductive layer above the one dielectric layer and a conductive layer below the one dielectric layer; and
the means for biasing biases the conductive layer above the one dielectric layer at a pass voltage which is less than a pass voltage of the conductive layer below the one dielectric layer.

* * * * *